(12) United States Patent
Ishibashi

(10) Patent No.: US 9,439,324 B2
(45) Date of Patent: Sep. 6, 2016

(54) ELECTRIC POWER CONVERTER

(71) Applicant: Mitsubishi Electric Corporation, Chiyoda-ku, Tokyo (JP)

(72) Inventor: Satoshi Ishibashi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 257 days.

(21) Appl. No.: 13/960,118

(22) Filed: Aug. 6, 2013

(65) Prior Publication Data

US 2014/0140117 A1 May 22, 2014

(30) Foreign Application Priority Data

Nov. 21, 2012 (JP) .................................. 2012-255178

(51) Int. Cl.
*H05K 7/20* (2006.01)
(52) U.S. Cl.
CPC ...... *H05K 7/20254* (2013.01); *H05K 7/20927* (2013.01); *H01L 2924/0002* (2013.01)
(58) Field of Classification Search
CPC .................... H05K 7/20927; H05K 7/20254; H01L 2924/0002
USPC .......................... 361/679.46–679.54, 688–723
See application file for complete search history.

(56) References Cited

U.S. PATENT DOCUMENTS

| | | | | |
|---|---|---|---|---|
| 2001/0014029 A1* | 8/2001 | Suzuki et al. | ................. | 363/141 |
| 2003/0132042 A1* | 7/2003 | Beihoff et al. | ................. | 180/65.1 |
| 2003/0133267 A1* | 7/2003 | Beihoff et al. | ................. | 361/704 |
| 2005/0168081 A1* | 8/2005 | Takenaka et al. | ............... | 310/64 |
| 2005/0253465 A1* | 11/2005 | Takenaka et al. | ............... | 310/52 |
| 2007/0246635 A1* | 10/2007 | Nakajima et al. | ............ | 248/637 |
| 2008/0049476 A1* | 2/2008 | Azuma et al. | ................. | 363/131 |
| 2008/0130223 A1* | 6/2008 | Nakamura et al. | ........... | 361/689 |
| 2008/0169088 A1* | 7/2008 | Aoki et al. | ............... | 165/104.19 |
| 2008/0225487 A1* | 9/2008 | Nakajima et al. | ............ | 361/699 |

(Continued)

FOREIGN PATENT DOCUMENTS

| | | |
|---|---|---|
| JP | 2007-012722 A | 1/2007 |
| JP | 2009-296708 A | 12/2009 |

(Continued)

OTHER PUBLICATIONS

Japanese Office Action (Preliminary Notice of Reasons for Rejection) dated Feb. 4, 2014, Patent Application No. 2012-255178.

*Primary Examiner* — David M Sinclair
*Assistant Examiner* — Robert Brown
(74) *Attorney, Agent, or Firm* — Sughrue Mion, PLLC

(57) ABSTRACT

The passage from a cooling medium inlet to a cooling medium outlet of a cooler includes: an upstream cooling portion and a downstream cooling portion for cooling heat generating bodies; an upstream distribution portion located on the cooling medium inlet side; a downstream distribution portion located on the cooling medium outlet side; a connecting portion for connecting the upstream cooling portion and the downstream cooling portion; and a partition portion for partitioning the upstream cooling portion and the downstream cooling portion, and the upstream distribution portion and the downstream distribution portion. The passage is connected so that the cooling medium flows in order of the upstream distribution portion, the upstream cooling portion, the connecting portion, the downstream cooling portion, and the downstream distribution portion.

13 Claims, 22 Drawing Sheets

(56) References Cited

U.S. PATENT DOCUMENTS

| | | | |
|---|---|---|---|
| 2008/0315736 A1* | 12/2008 | Yamada et al. | 312/236 |
| 2010/0025126 A1* | 2/2010 | Nakatsu et al. | 180/65.1 |
| 2010/0182747 A1* | 7/2010 | Yoshida et al. | 361/689 |
| 2010/0208427 A1* | 8/2010 | Horiuchi et al. | 361/699 |
| 2010/0321889 A1* | 12/2010 | Yoshino et al. | 361/702 |
| 2011/0188204 A1* | 8/2011 | Horiuchi et al. | 361/702 |
| 2012/0008286 A1* | 1/2012 | Suzuki | 361/730 |
| 2012/0188712 A1* | 7/2012 | Ishibashi et al. | 361/688 |
| 2013/0153186 A1* | 6/2013 | Gotou et al. | 165/168 |
| 2013/0228322 A1* | 9/2013 | Yasuda et al. | 165/185 |
| 2013/0301328 A1* | 11/2013 | Ito | 363/141 |
| 2013/0312933 A1* | 11/2013 | Sharaf | 165/80.4 |
| 2014/0198449 A1* | 7/2014 | Osada et al. | 361/689 |

FOREIGN PATENT DOCUMENTS

| | | |
|---|---|---|
| JP | 2010-287600 A | 12/2010 |
| JP | 2011-17516 A | 1/2011 |
| JP | 2012-104583 A | 5/2012 |

* cited by examiner

FIG. 3A
PRIOR ART 1
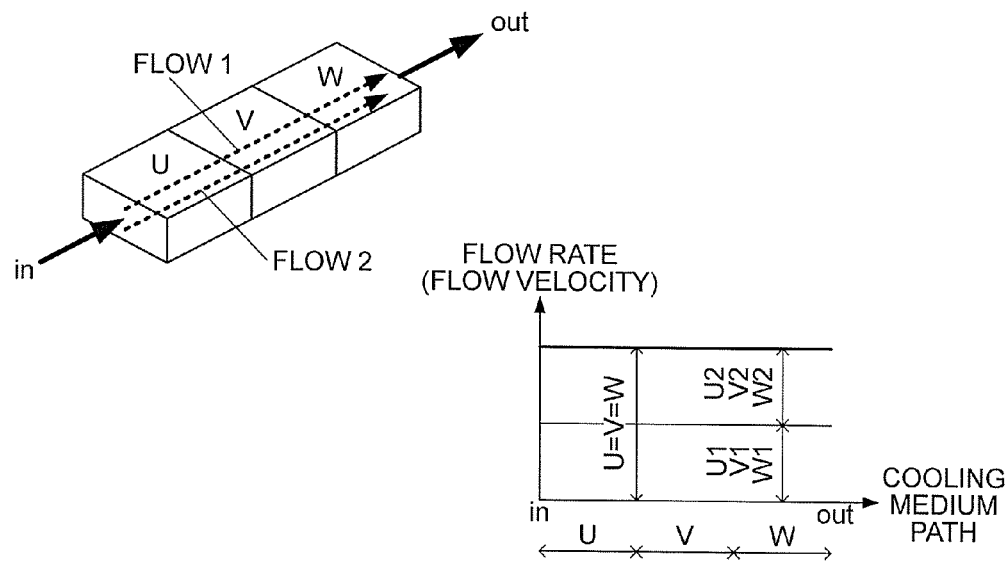
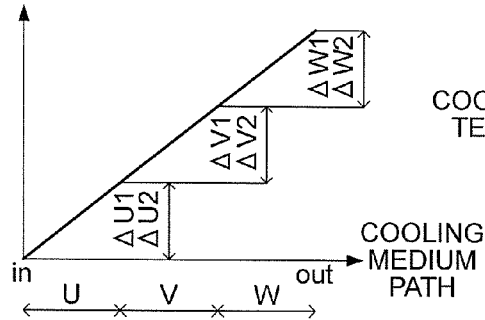
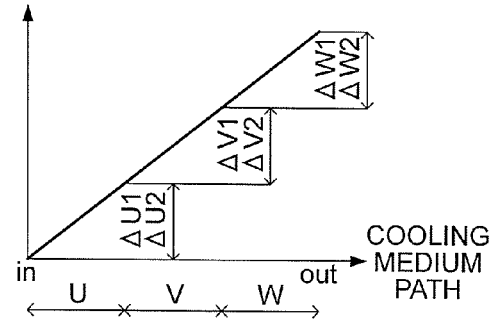

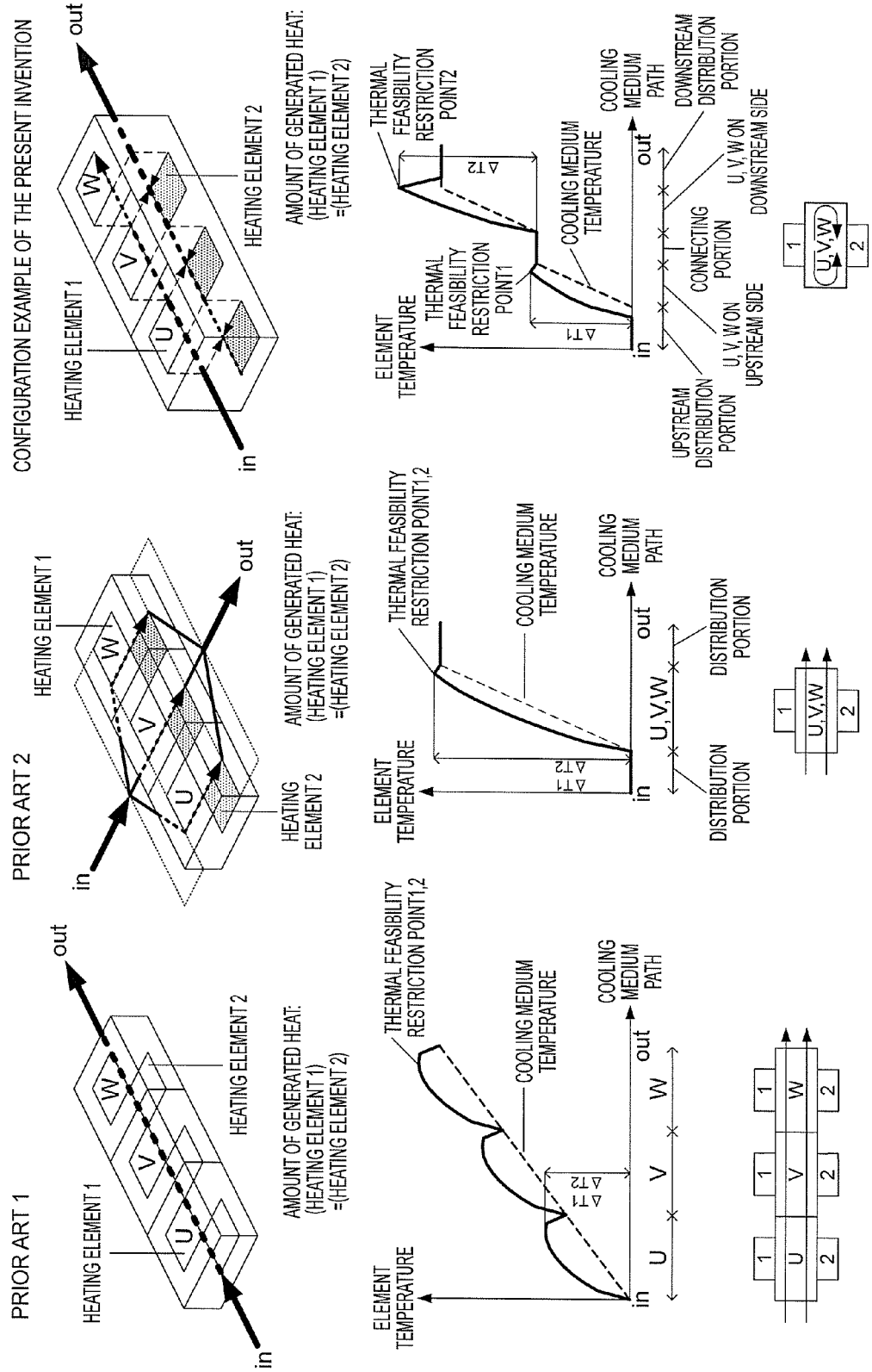

FIG. 6
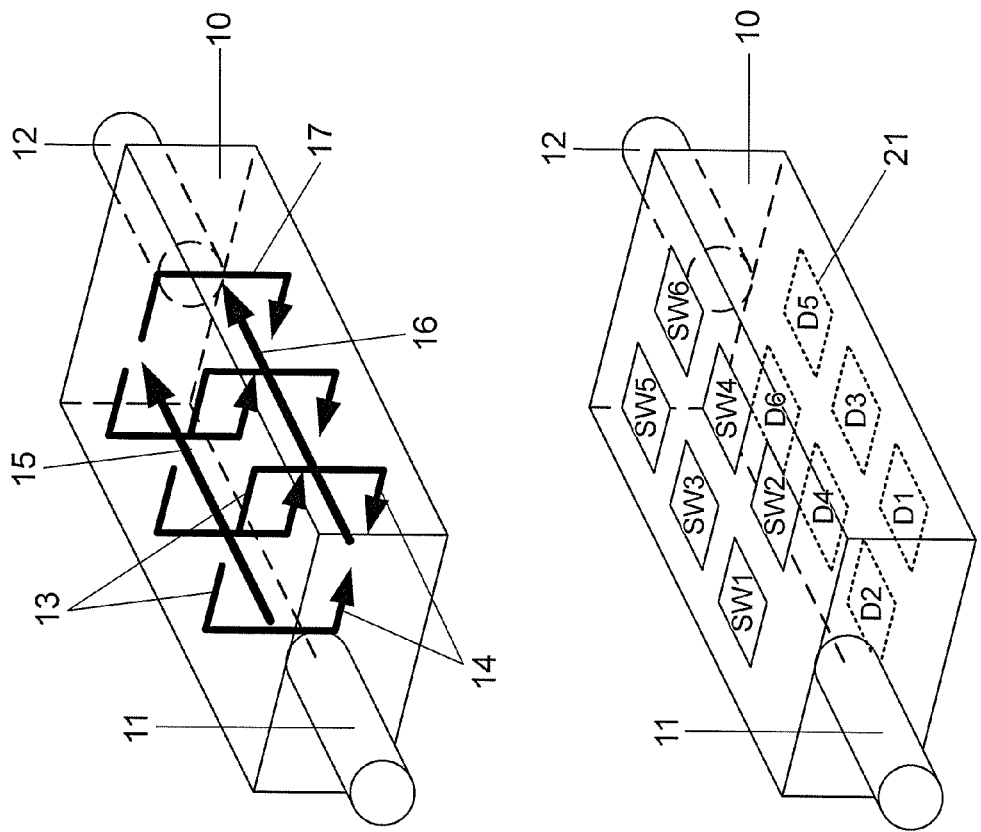
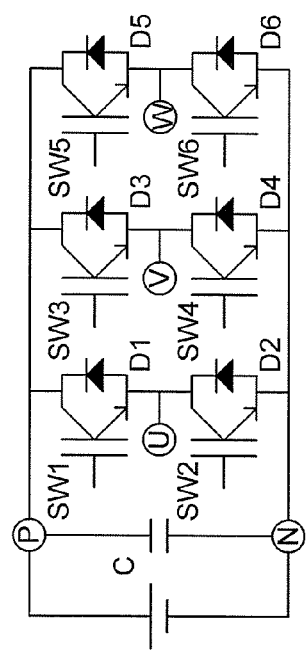
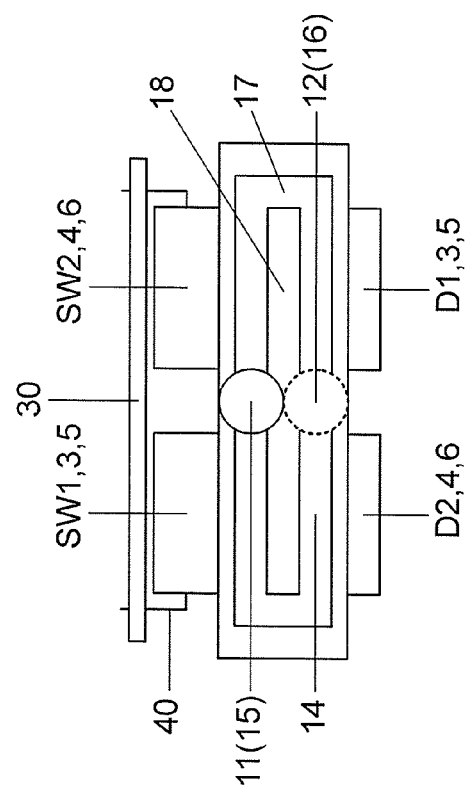

FIG. 8
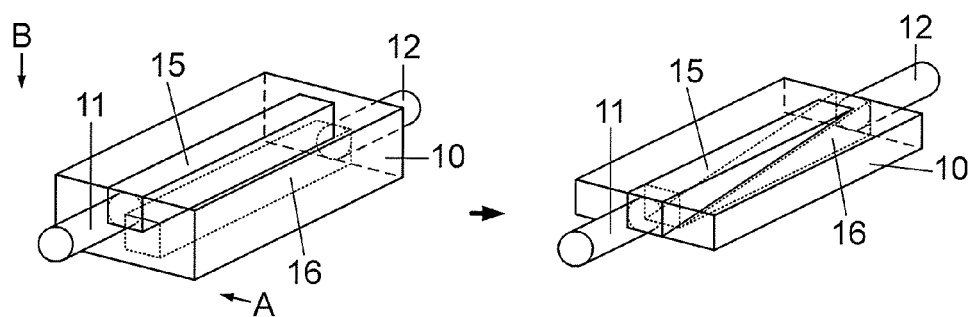
<CROSS SECTION VIEWED IN DIRECTION OF ARROW A>
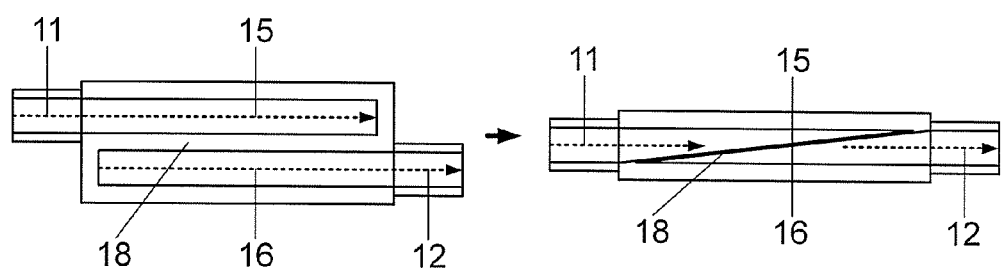
<CROSS SECTION VIEWED IN DIRECTION OF ARROW B>
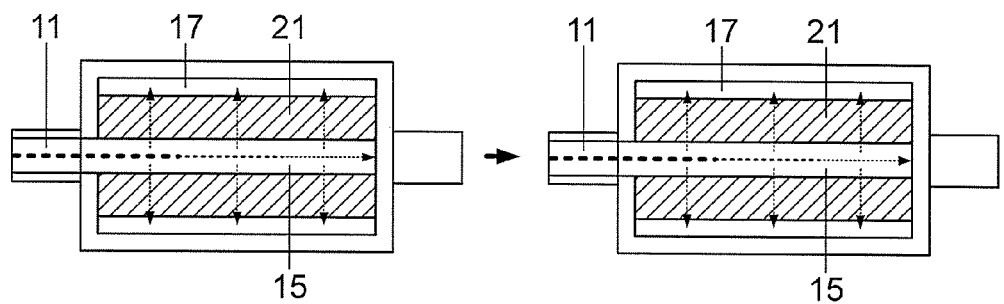

ELECTRIC POWER CONVERTER

BACKGROUND OF THE INVENTION

1. Field of the Invention

The present invention relates to an electric power converter such as an inverter apparatus using a semiconductor element or a semiconductor module.

2. Description of the Related Art

In an electric power converter including a plurality of semiconductor elements or semiconductor modules and a cooler for cooling the semiconductors, the plurality of semiconductor elements or semiconductor modules are arranged on the cooler, and hence a cooling medium for cooling increases in temperature while flowing from an upstream side to a downstream side. Therefore, due to the increase in temperature of the cooling medium, semiconductor elements or semiconductor modules on the downstream side have stricter temperature constraints than those of semiconductor elements or semiconductor modules on the upstream side and are limited in power that can be applied thereto, which has posed problems in increasing output and reducing the size and cost of the electric power converter.

Meanwhile, there has been proposed an electric power converter in which two inverters and one converter are integrated (see, for example, Japanese Patent Application Laid-open No. 2009-296708). To be specific, a configuration is adopted in which a meandering groove is formed in a water jacket to constitute a cooling medium passage, and three power modules constituting a first inverter, three power modules constituting a second inverter, and a power module constituting a converter are arranged in the stated order in the cooling medium passage so that the semiconductor elements included in the power modules are cooled.

However, in the configuration of Japanese Patent Application Laid-open No. 2009-296708, the cooling medium is increased in the temperature due to heat generated by the first inverter, and the second inverter needs to be cooled by the cooling medium having the increased temperature. Therefore, the second inverter needs to be reduced in output as compared to the first inverter to reduce heat generated by the semiconductor elements, needs to be increased in a heat dissipation property to decrease the increase in temperature of the semiconductor elements, or needs to use semiconductor elements having a higher allowable temperature.

Note that, when the output is reduced, providing high power becomes difficult. When the heat dissipation property is increased, reductions in size (heat dissipation property is proportional to a heat dissipation area) and in cost (highly thermal conductive member needs to be used) become difficult. When the semiconductor elements having a higher allowable temperature are used, difficulty in reducing the cost (high heat-resistant member needs to be used) and other such problems arise in the converter.

In addition, due to the heat generated by the first inverter and the second inverter, the temperature of the cooling medium used to cool the converter is further increased than that for the second inverter, and hence bigger problems than those of the second inverter arise.

As a countermeasure against the increase in temperature of the cooling medium, there has been proposed a configuration in which semiconductor elements (insulated gate bipolar transistors: IGBTs), which generate a large amount of heat, and semiconductor elements (diodes), which generate a small amount of heat, are arranged on the upstream side and the downstream side of the cooling medium passage, respectively, to thereby reduce adverse effects of the increased cooling medium temperature (see, for example, Japanese Patent Application Laid-open No. 2007-12722).

However, the related technologies have the following problems.

In the configuration of Japanese Patent Application Laid-open No. 2007-12722, the IGBTs and the diodes are arranged in series with respect to the flow of the cooling medium, but the individual semiconductor groups (for example, the minimum units each constituted of a pair of an IGBT and a diode) constituting the electric power converter are all arranged in parallel with respect to the cooling medium passage.

In the electric power converter including one inverter as in Japanese Patent Application Laid-open No. 2007-12722, six cooling medium passages are formed in parallel, and accordingly a flow rate of the cooling medium that can be used by each semiconductor group is $\frac{1}{6}$ as compared to the case where the series passage is adopted as in Japanese Patent Application Laid-open No. 2009-296708. When the flow rate of the cooling medium becomes lower, a heat dissipation performance of the cooler is reduced and further the increase in temperature of the cooling medium in each semiconductor group becomes larger.

Therefore, assuming a case where the configuration of Japanese Patent Application Laid-open No. 2007-12722 is applied to the high-capacity electric power converter in which two inverters and one converter are integrated as in Japanese Patent Application Laid-open No. 2009-296708, thirteen cooling medium passages are formed in parallel and the flow rate of the cooling medium that can be used by each semiconductor group is $\frac{1}{13}$, with the result that the heat dissipation performance of the cooler is significantly reduced and the problems of Japanese Patent Application Laid-open No. 2007-12722 become more pronounced.

Moreover, the increase in temperature from an inlet to an outlet of the passage of the cooling medium is determined by a relationship between total generated heat from the inlet to the outlet and the flow rate. In the high-capacity electric power converter as in Japanese Patent Application Laid-open No. 2009-296708, the total generated heat from the inlet to the outlet is increased, but when the parallel passage configuration as in Japanese Patent Application Laid-open No. 2007-12722 is adapted thereto, the flow rate of the cooling medium of each semiconductor group is further reduced significantly.

Therefore, the increase in temperature of the cooling medium that occurs in one semiconductor group becomes very large to cause a large temperature difference in one semiconductor element, which leads to a deteriorated current distribution inside the semiconductor element, and further to new problems such as adverse effects on the electrical characteristics of the semiconductor element, such as a damage due to local heating of the semiconductor element caused by the concentrated current and a reduction in short circuit capacity.

Moreover, in Japanese Patent Application Laid-open No. 2007-12722, in order to arrange all the semiconductor elements at the uppermost stream of the cooling medium passages, it is proposed to arrange the semiconductor elements in parallel so that the semiconductor elements are not arranged in series in the individual passages, and to configure the passage so that the passage is bifurcated on the upstream side and the divided passages are merged after respectively having cooled one semiconductor element to flow to the downstream side.

However, in this configuration, the temperature difference between the upstream side and the downstream side of the cooling medium occurs while the cooling medium passes through only the respective ones of the semiconductor elements, and hence the temperature differences within the respective semiconductor elements become clearly larger than the above-mentioned example. In addition, it is necessary to arrange the semiconductor elements in line and to configure the passage so that the passage is bifurcated on the upstream side and the cooling medium is distributed to the respective semiconductor elements, and hence there have been cases where reduction in size is difficult and the flexibility in configuring the arrangement of components is low.

Moreover, in Japanese Patent Application Laid-open No. 2007-12722, as countermeasures against deterioration of thermal feasibility due to the increase in temperature of the cooling medium, efforts have been made to reduce the adverse effects of thermal interference between the semiconductors by arranging semiconductors on both surfaces of the cooler, arranging a diode, which generates a small amount of heat, immediately below an IGBT, which generates a large amount of heat, and other such efforts, to thereby improve the heat dissipation property. Thus, the efforts to reduce the adverse effects of thermal interference between the semiconductors and improve the heat dissipation property have been made, but a solution for the larger increase in temperature of the cooling medium in each semiconductor group due to the distribution of the flow rate of the cooling medium has not been proposed.

Moreover, in order to arrange the IGBTs to be connected to a control board for driving the semiconductor elements on upper and lower sides of the cooler, the connection configuration with the control board arranged on one side of the semiconductor module becomes complicated. In addition, the cooling medium passages are included in the semiconductor module, and hence as a countermeasure against a leakage of the cooling medium, the cooler, which includes the passages, and the semiconductor module need to be integrated, which results in difficulties in increasing the size of the semiconductor module and the capacity.

SUMMARY OF THE INVENTION

The present invention has been made to solve the above-mentioned problems, and therefore has an object to provide an electric power converter that requires low cost and has an excellent cooling performance.

According to an exemplary embodiment of the present invention, there is provided an electric power converter, including: a cooler, which includes a passage through which a cooling medium flows; and at least two heat generating bodies, which are dispersedly arranged on two opposing main surfaces of the cooler to be cooled by the cooler. The passage from a cooling medium inlet to a cooling medium outlet of the cooler includes: an upstream cooling portion and a downstream cooling portion for cooling the at least two heat generating bodies; an upstream distribution portion located on the cooling medium inlet side; a downstream distribution portion located on the cooling medium outlet side; a connecting portion for connecting the upstream cooling portion and the downstream cooling portion; and a partition portion for partitioning the upstream cooling portion and the downstream cooling portion, and the upstream distribution portion and the downstream distribution portion. The passage is connected so that the cooling medium flows in order of the upstream distribution portion, the upstream cooling portion, the connecting portion, the downstream cooling portion, and the downstream distribution portion.

According to the present invention, the electric power converter includes: the cooler, which includes the passage through which a cooling medium flows; and the at least two heat generating bodies, which are dispersedly arranged on the two opposing main surfaces of the cooler to be cooled by the cooler. The passage from the cooling medium inlet to the cooling medium outlet of the cooler includes: the upstream cooling portion and the downstream cooling portion for cooling the at least two heat generating bodies; the upstream distribution portion located on the cooling medium inlet side; the downstream distribution portion located on the cooling medium outlet side; the connecting portion for connecting the upstream cooling portion and the downstream cooling portion; and the partition portion for partitioning the upstream cooling portion and the downstream cooling portion, and the upstream distribution portion and the downstream distribution portion. The passage is connected so that the cooling medium flows in order of the upstream distribution portion, the upstream cooling portion, the connecting portion, the downstream cooling portion, and the downstream distribution portion.

Thus, it is possible to obtain the electric power converter that requires low cost and has excellent cooling performance.

BRIEF DESCRIPTION OF THE DRAWINGS

In the accompanying drawings:

FIGS. 3A to 3C are explanatory diagrams illustrating effects of the electric power converter according to the first embodiment of the present invention along with problems of Japanese Patent Application Laid-open No. 2009-296708 and Japanese Patent Application Laid-open No. 2007-12722;

FIG. 4 is an explanatory diagram illustrating, in the electric power converter according to the first embodiment of the present invention, effects of increases in temperature of a cooling medium when heat generating bodies generating equal amounts of heat are arranged on upper and lower sides of each phase, in comparison with Japanese Patent Application Laid-open No. 2009-296708 and Japanese Patent Application Laid-open No. 2007-12722;

FIG. 6 is an explanatory diagram illustrating, in the electric power converter according to the first embodiment of the present invention, an example of a case where switching elements are arranged on an upstream cooling portion;

FIG. 8 is an explanatory diagram illustrating a reduction in height of distribution portions in the electric power converter according to the first embodiment of the present invention;

DETAILED DESCRIPTION OF THE PREFERRED EMBODIMENTS

Figure 1:
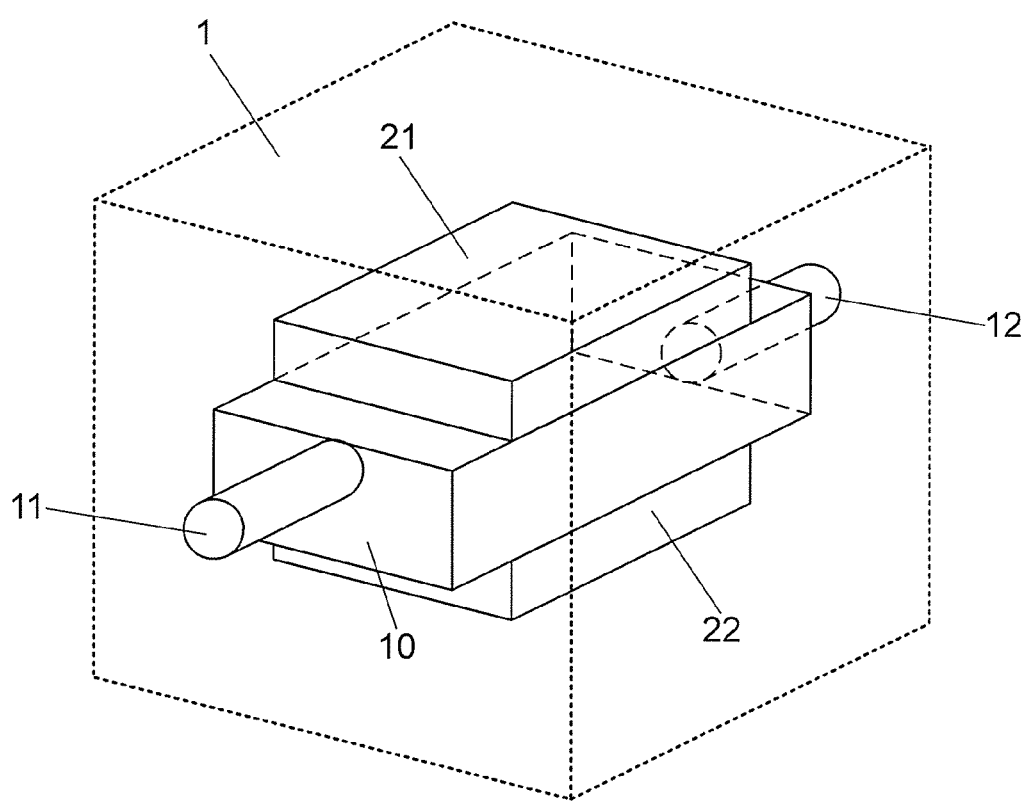
FIG. 1 is a perspective view illustrating a basic configuration of an electric power converter according to a first embodiment of the present invention.

Referring to the accompanying drawings, an electric power converter according to exemplary embodiments of the present invention is described below. In the drawings, the same or corresponding parts are denoted by the same reference symbols.

First Embodiment

FIG. 1 is a perspective view illustrating a basic configuration of an electric power converter 1 according to a first embodiment of the present invention. In FIG. 1, the electric power converter 1 includes a cooler 10, which includes a passage through which a cooling medium flows, and two heat generating bodies 21 and 22 to be cooled by the cooler 10. The heat generating bodies 21 and 22 are dispersedly arranged on two opposing main surfaces of the cooler 10.

Note that, in FIG. 1, it is provisionally defined that the two main surfaces on which the heat generating bodies 21 and 22 are mounted are in an up and down direction, that two directions perpendicular thereto as a front and back direction and a left and right direction, that surfaces having a cooling medium inlet 11 and a cooling medium outlet 12 are in the front and back direction, and that surfaces not having the cooling medium inlet 11 and the cooling medium outlet 12 are in the left and right direction, but the configuration according to the first embodiment of the present invention is not limited to the up, down, left, and right directions.

In addition, in FIG. 1, the cooling medium inlet 11 and the cooling medium outlet 12 are arranged separately on the opposing surfaces. However, the cooling medium inlet 11 and the cooling medium outlet 12 do not necessarily need to be opposed to each other, and may be arranged on one surface collectively or on different non-opposing surfaces.

Figure 2:
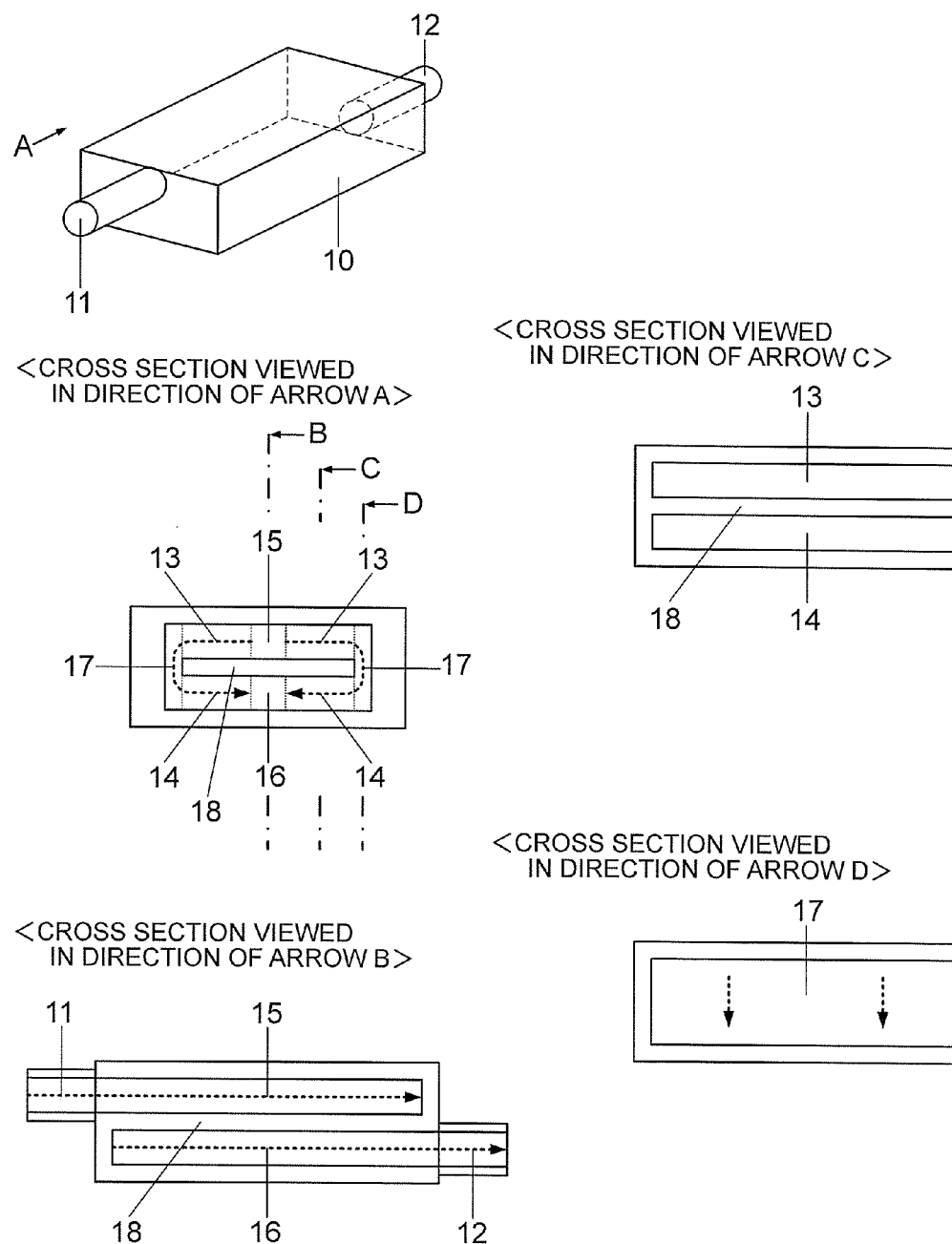
FIG. 2 is a configuration diagram illustrating a cooling medium passage of a cooler in the electric power converter according to the first embodiment of the present invention.

FIG. 2 is a configuration diagram illustrating a cooling medium passage of the cooler 10 in the electric power converter 1 according to the first embodiment of the present invention. In FIG. 2, the passage from the cooling medium inlet 11 to the cooling medium outlet 12 includes an upstream cooling portion 13 and a downstream cooling portion 14 for cooling the heat generating bodies 21 and 22, an upstream distribution portion 15 located on the cooling medium inlet 11 side, a downstream distribution portion 16 located on the cooling medium outlet 12 side, a connecting portion 17, and a partition portion 18.

Moreover, the passage in the cooler 10 is connected so that the cooling medium flows in order of the upstream distribution portion 15, the upstream cooling portion 13, the connecting portion 17, the downstream cooling portion 14, and the downstream distribution portion 16. The upstream distribution portion 15 and the downstream distribution portion 16 are arranged in a stacked manner with the interposition of the partition portion 18, and the upstream cooling portion 13 and the downstream cooling portion 14 are arranged in a stacked manner with the interposition of the partition portion 18.

Next referring to FIGS. 3A to 5, features of the configuration of the passage of the cooler according to the first embodiment of the present invention are described along with comparison to Japanese Patent Application Laid-open No. 2009-296708 and Japanese Patent Application Laid-open No. 2007-12722. FIGS. 3A to 5 take as an example a three-phase inverter including semiconductor modules as the heat generating bodies, and illustrate examples in which two semiconductor modules for each of U, V, and W phases are arranged on upper and lower sides of the cooler.

Figure 3B:
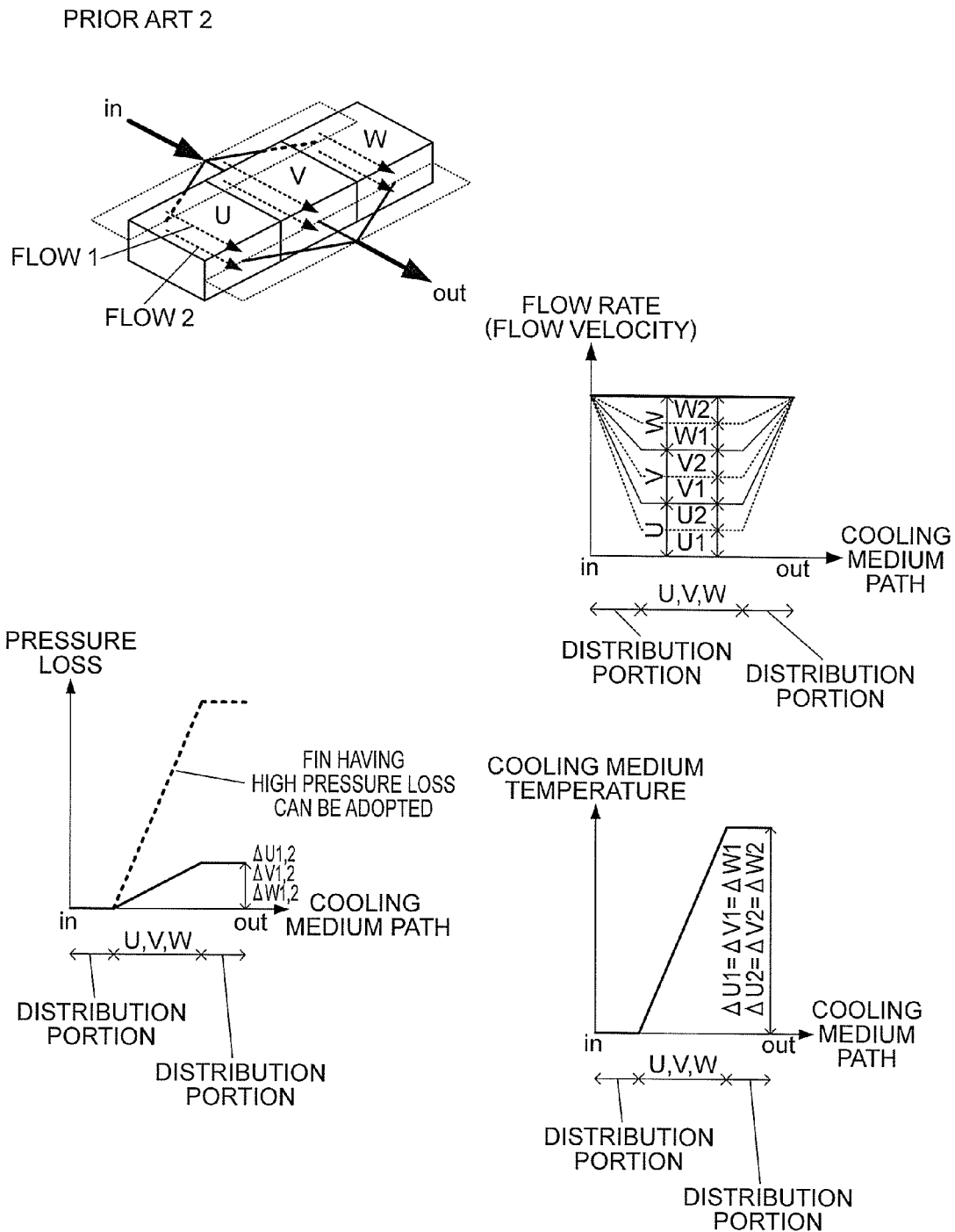
Figure 3C:
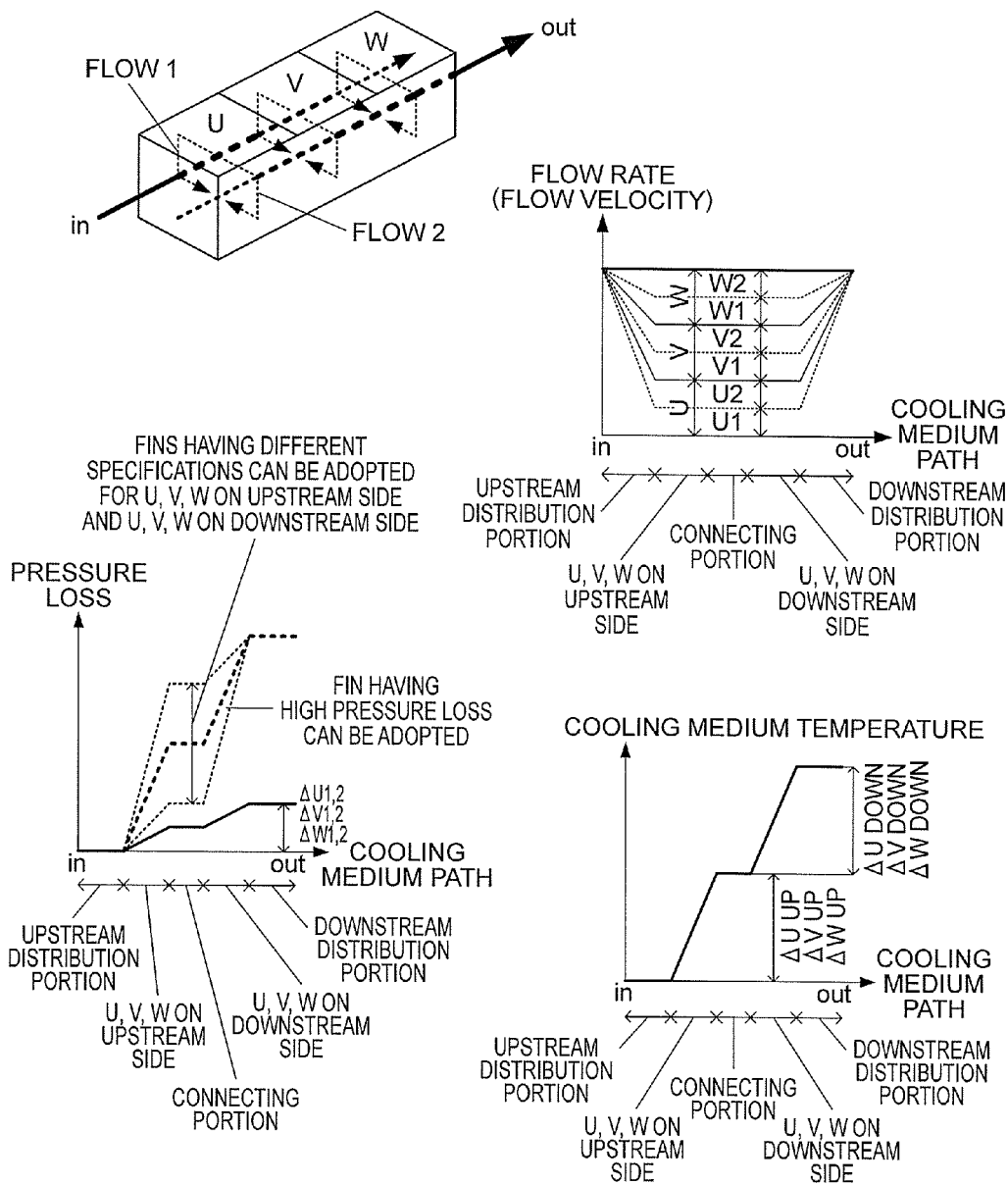

FIGS. 3A to 3C are explanatory diagrams illustrating effects of the electric power converter according to the first embodiment of the present invention, along with problems of Japanese Patent Application Laid-open No. 2009-296708 and Japanese Patent Application Laid-open No. 2007-12722. In FIGS. 3A to 3C, the example of Japanese Patent Application Laid-open No. 2009-296708 is a configuration in which cooling portions of the U, V, and W phases are coupled in series, and the example of Japanese Patent Application Laid-open No. 2007-12722 has a configuration in which the cooling portions of the U, V, and W phases are coupled in parallel. In both configurations, the heat generating bodies are arranged separately on the upper and lower sides of the cooler, and hence the passage is also bifurcated into an upper stream 1 and a lower stream 2.

On the other hand, in the configuration of the present invention, the cooling portions of the U, V, and W phases are coupled in parallel. To be more specific, the configuration in which, in each of the U, V, and W phases, the flow on an upstream side for cooling the heat generating bodies mounted on the upper side and a flow on a downstream side for cooling the heat generating bodies mounted on the lower side are coupled in series is adopted, and the passage is bifurcated into a left stream 1 and a right stream 2.

With this configuration, when the flow rate at the cooling medium inlet is 1, in Japanese Patent Application Laid-open No. 2009-296708, the cooling portions have equal flow rates in all the U, V, and W phases so that each phase has a flow rate of 1. Further, the passage is bifurcated into upper and lower streams in each phase, and hence each of the upper and lower cooling portions has a flow rate that is half the inlet flow rate.

In Japanese Patent Application Laid-open No. 2007-12722, the passage is divided into the three U, V, and W phases so that each phase has a flow rate that is ⅓ of the inlet flow rate. Further, the passage is bifurcated into the upper and lower streams in each phase, and hence the flow rate of each of the upper and lower cooling portions is half the flow rate of each phase, that is, ⅙ of the inlet flow rate.

Also in the configuration of the present invention, the passage is divided into the three U, V, and W phases so that each phase has a flow rate that is ⅓ of the inlet flow rate. Further, the passage is bifurcated into the left and right streams in each phase, and hence the flow rate of each of the cooling portions is half the flow rate of each phase, that is, ⅙ of the inlet flow rate as in the configuration of Japanese Patent Application Laid-open No. 2007-12722. It should be noted, however, that in the case of Japanese Patent Application Laid-open No. 2007-12722, the flow rate of each phase is bifurcated into the upper and lower streams, while in the configuration of the present invention, the flow rate is bifurcated into left and right streams.

A pressure loss is expressed here by the Bernoulli's theorem as $\Delta P = \zeta \times \frac{1}{2} \times \rho \times u^2$, which is proportional to the flow velocity, where $\Delta P$ is the pressure loss, $\zeta$ is a pressure loss coefficient that depends on the shape of the passage, $\rho$ [kg/m³] is the density of the cooling medium, and u [m/s] is a flow velocity of the cooling medium. In addition, the flow velocity u [m/s] is determined by a relationship of the flow rate V [m³/s] that passes through a passage cross sectional area S [m²], that is, u=V/S, and hence the pressure loss is proportional to the flow rate of the cooling medium and inversely proportional to the passage cross sectional area.

The configuration of Japanese Patent Application Laid-open No. 2009-296708 has the highest flow rate of the cooling medium and the smallest passage cross sectional area. Further, the configuration of Japanese Patent Application Laid-open No. 2009-296708 also has the longest cooling medium path, which leads to the largest pressure loss. The configurations of Japanese Patent Application Laid-open No. 2007-12722 and the present invention have low flow rates of the cooling medium and large passage cross sectional areas, as well as short cooling medium paths, which results in smaller pressure losses than in Japanese Patent Application Laid-open No. 2009-296708.

When the pressure loss is small, an advantage that the entire cooling system including a cooling medium discharge pump and the like may be reduced in size and cost may be obtained, but if a cooling discharge pump having the equal level of performance may be used, heat radiating fins having higher pressure loss may be set to the cooling portions as the pressure loss of the passage becomes smaller, which leads to higher flexibility in designing the fins and facilitates improvement in the cooling performance. Therefore, the configurations of Japanese Patent Application Laid-open No. 2007-12722 and the present invention are more flexible in designing the fins and easier to improve the cooling performance than the other configuration, and allow reductions in size of the cooling system as well as the electric power converter.

In the configurations of Japanese Patent Application Laid-open No. 2007-12722 and the present invention, the flow rate of each cooling portion is low. Therefore, in order to secure the cooling performance in proportion to the flow velocity, efforts are made to reduce the passage cross sectional area and increase the flow velocity at the same flow rate, and at the same time, in order to secure the heat dissipation area, the fins are formed. When the heat generating bodies that make contact with the cooling portions with the same area are cooled, in order to reduce the passage cross sectional area, which is determined by a product of a passage width and a passage height, there is no choice but to reduce the passage height, which results in a reduction in height of the passage, and further in reductions in height of the cooler and the electric power converter.

The pressure loss is increased when the passage cross sectional area is reduced and the fins are formed at the same time, but as described above, the configuration of the present invention has a small pressure loss, which allows a reduction in passage cross sectional area with the same allowable pressure loss, and hence allows reductions in height of the passage, the cooler, and the electric power converter. Those reductions in height facilitates dispersedly arranging the heat generating bodies on both sides of the cooler, and hence as in the present invention, dimensions for providing the partition portion between the upper and lower cooling portions may be secured.

The increase in temperature of the cooling medium due to heat input from the heat generating bodies may be expressed by the energy equation as $\Delta T = T_{out} - T_{in} = Cp \times Gr/Q$, where Tin [K] is the inlet temperature, Tout [K] is the outlet temperature, $\Delta T$ [K] is the increase in temperature, Q [W] is the heat input amount, Cp [J/(kg·K)] is the specific heat at constant pressure of the cooling medium, and Gr [kg/s] is the mass flow rate of the cooling medium.

In addition, the increase in temperature of the cooling medium from the cooling medium inlet to the cooling medium outlet is proportional to the total heat input amount to the cooler and the total flow rate, that is, the total generated heat of the heat generating bodies and the inlet flow rate of the cooling medium, which makes no difference between the configurations of Japanese Patent Application Laid-open No. 2009-296708 and Japanese Patent Application Laid-open No. 2007-12722 and the present invention under the same conditions of the total heat input amount and the inlet flow rate. However, the difference in configuration of the passages generates a difference in flow rate among the cooling portions, and hence as illustrated in FIGS. 3A to 3C, increases in temperature of the cooling medium are different among the cooling portions.

In Japanese Patent Application Laid-open No. 2009-296708, the increase in temperature of the cooling medium in each individual cooling portion, that is, the temperature distribution within the semiconductor element is small, and the effects of the temperature characteristics of the semiconductor element on the difference in characteristics are small. However, the temperature of the cooling medium in the W phase at the lowermost stream is high so that the thermal feasibility of the semiconductor modules is significantly different between the U phase on the upstream side and the W phase on the downstream side, and the thermal feasibility of the electric power converter is controlled by the semiconductor modules in the W phase on the lowermost stream side.

On this occasion, in order to use common components, when semiconductor modules generating the same amount of heat and having the same heat dissipation performance are used, wastes in cost and size are generated in all the semiconductor modules other than those on the lowermost stream side. As a countermeasure against this problem, when semiconductor modules generating individual amounts of heat and having individual heat dissipation performances are used so that each semiconductor module is designed to have optimal thermal feasibility, common components cannot be used, which makes a reduction in cost difficult.

In Japanese Patent Application Laid-open No. 2007-12722, the configuration of the cooling medium passage is devised so that the passages are designed to make initial temperatures of the cooling medium equal in all the upper and lower cooling portions in each of the U, V, and W phases, which makes no difference in thermal feasibility among the semiconductor modules, and hence the problems as in Japanese Patent Application Laid-open No. 2009-296708 do not occur.

However, an increase in temperature of the cooling medium in one cooling portion is large to cause a large temperature difference inside the semiconductor module, that is, a large temperature difference within the semiconductor element, and hence the temperature characteristics of the semiconductor module leads to a deteriorated current distribution inside the semiconductor module, and further to new problems such as adverse effects on the electrical characteristics of the semiconductor element, such as a damage due to local heating of the semiconductor element caused by the concentrated current and a reduction in short circuit capacity.

As a result, the temperature at the lowermost stream of the cooling medium restricts the thermal feasibility of all the semiconductor modules, which after all is a mere expansion of the problems at the lowermost stream of Japanese Patent Application Laid-open No. 2009-296708 to all the semiconductor modules.

On the other hand, in the configuration according to the first embodiment of the present invention, the cooling medium is bifurcated into the left and right streams at around the center of the upper cooling portion so that the increase in temperature of the cooling medium in each cooling portion is halved as compared to Japanese Patent Application Laid-open No. 2007-12722, and the temperature difference inside the semiconductor module may be reduced significantly as compared to Japanese Patent Application Laid-open No. 2007-12722.

Meanwhile, in the lower cooling portion, the cooling medium has an increased temperature due to the heat input in the upper cooling portion, and hence has stricter thermal feasibility in the lower semiconductor modules than in the upper semiconductor modules. However, as the IGBTs functioning as the switching elements and the diodes functioning as free wheel elements generate different amounts of heat, the upper and lower semiconductor modules do not necessarily generate the same amount of heat, and when the heat generating bodies that are highly thermally feasible are arranged on the lower side, the thermal feasibility of the entire apparatus is improved.

It is a feature of the present invention to improve the thermal feasibility of the entire apparatus by devising the arrangement of the heat generating bodies on the upper and lower sides. If the heat generating bodies that are highly thermally feasible are arranged on the lower side, in the case of Japanese Patent Application Laid-open No. 2009-296708, the thermal feasibility of the entire apparatus is controlled by the upper heat generating bodies at the lowermost stream, and in the case of Japanese Patent Application Laid-open No. 2007-12722, the thermal feasibility of the entire apparatus is controlled by the upper heat generating bodies in each phase, and thus the thermal feasibility of the apparatus is not improved by devising the arrangement of the heat generating bodies.

In addition, in the configuration of the present invention, the passage in which the upper cooling portion and the lower cooling portion are independently arranged in series is adopted, and the pressure loss, that is, the heat dissipation performance may be changed between the upper cooling portion and the lower cooling portion. On the other hand, when the upper and lower cooling portions have different pressure losses in Japanese Patent Application Laid-open No. 2009-296708 and Japanese Patent Application Laid-open No. 2007-12722, the flow rate of the cooling medium is concentrated on the side with a smaller pressure loss and the cooling medium does not flow on the side with a larger pressure loss, resulting in a deteriorated heat dissipation performance.

To be more specific, when cooling fins are arranged at high density in order to increase the heat dissipation performance of the upper cooling portion that generates a large amount of heat and has strict thermal feasibility, the pressure loss of only the upper cooling portion is increased. As a result, the cooling medium selectively flows on the lower side with a smaller pressure loss, the flow rate on the upper side where a high heat dissipation performance is required is reduced, and an expected heat dissipation performance cannot be ensured.

On the other hand, in the configuration of the present invention with the serial passage, the change of pressure loss between the upper cooling portion and the lower cooling portion does not make any difference in flow rate between the upper and lower sides, and the pressure losses, that is, the heat dissipation performance of the upper and lower cooling portions may be optimized depending on the amounts of generated heat on the upper and lower sides.

When the cooling fins are arranged at high density in order to increase the heat dissipation performance of the upper cooling portion that generates a large amount of heat and has strict thermal feasibility as in the above-mentioned example, the pressure loss of the upper cooling portion is increased. However, because there is no another path with a smaller pressure loss, the cooling medium flow through the upper passage with the increased pressure loss just as before, and the flow rate on the upper side where a high heat dissipation performance is required is not reduced, with the result that the expected heat dissipation performance can be ensured.

Figure 5:
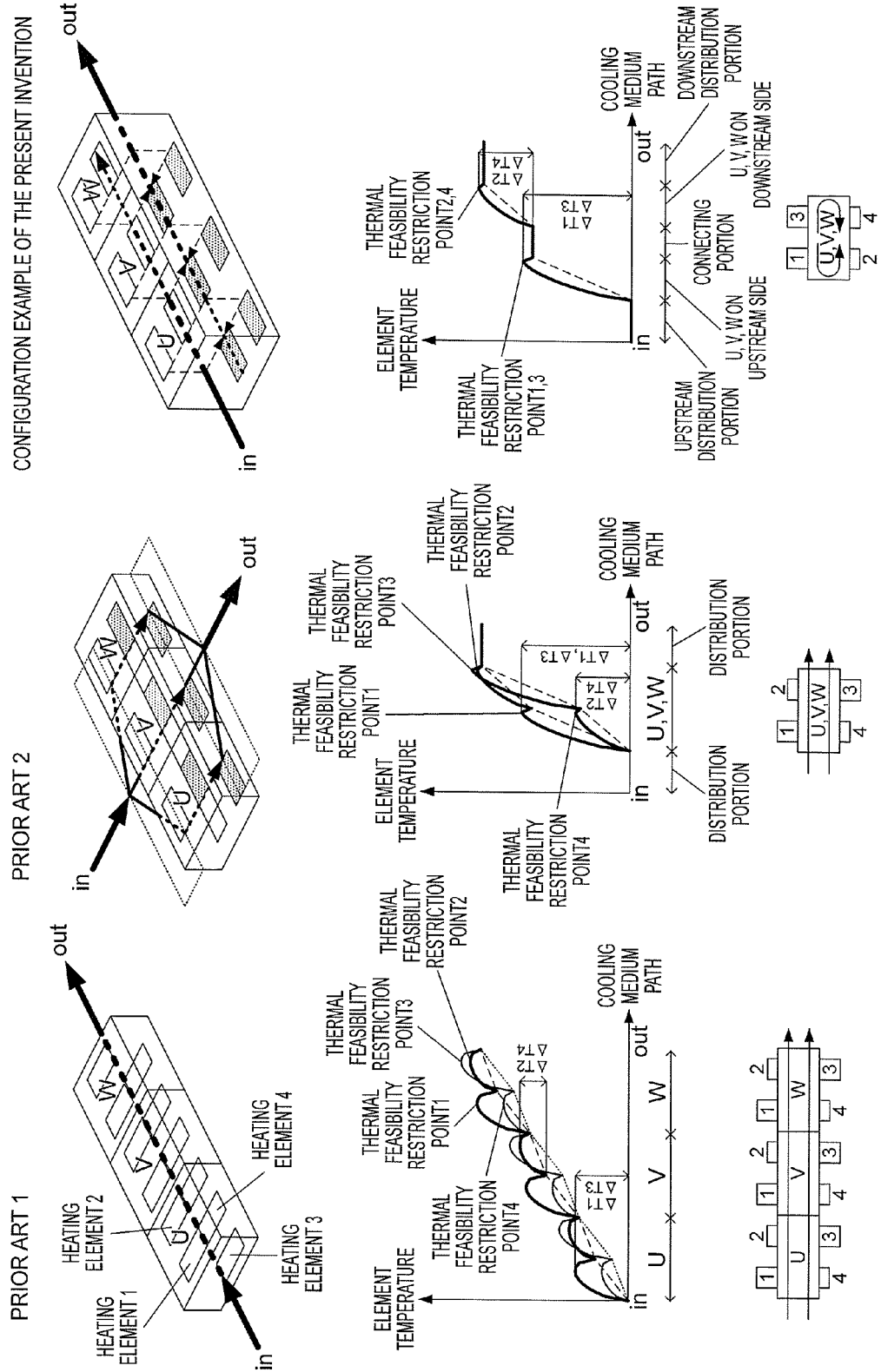
FIG. 5 is an explanatory diagram illustrating, in the electric power converter according to the first embodiment of the present invention, effects of increases in temperature of the cooling medium when heat generating bodies generating different amounts of heat are arranged on upper and lower sides of each phase in consideration of thermal interference, in comparison with Japanese Patent Application Laid-open No. 2009-296708 and Japanese Patent Application Laid-open No. 2007-12722.

Next referring to FIGS. 4 and 5, a description is given of the flow rate of the cooling medium and the increase in temperature of the cooling medium with the configuration of the present invention, and features and effects of arrangements of the heat generating bodies, to thereby describe the effects of the passage configuration of the present invention more specifically.

A semiconductor module including semiconductor elements as heat generating bodies is assumed here. However, the heat generating bodies are not limited to the semiconductor elements or semiconductor modules, and a control board, all devices and components in the electric power converter, such as a high current circuit and passive components such as a smoothing capacitor and a reactor may be the subject. In addition, depending on the specifications of the electric power converter, the shapes, the number of divisions, and the arrangement of the heat generating bodies may be selected arbitrarily.

FIG. 4 is an explanatory diagram illustrating, in the electric power converter according to the first embodiment of the present invention, effects of increases in temperature of the cooling medium when the heat generating bodies generating equal amounts of heat are arranged on upper and lower sides of each phase, in comparison with Japanese Patent Application Laid-open No. 2009-296708 and Japanese Patent Application Laid-open No. 2007-12722. FIG. 4 illustrates examples in which a heating element 1 and a heating element 2 are mounted respectively on the upper cooling portion and the lower cooling portion of each phase, and assumes a case where the heating element 1 and the heating element 2 generate and dissipate equal amounts of heat. For example, if each of the heat generating bodies is a semiconductor module including one IGBT and one diode, a first three-phase inverter and a second three-phase inverter may be constituted on upper and lower sides, respectively.

In the configuration of Japanese Patent Application Laid-open No. 2009-296708, the U, V, and W phases are arranged in series, and hence there is an advantage in that the temperature difference within each heating element is small. However, the thermal feasibility of both the heating element 1 and the heating element 2 is determined by the heat generating bodies in the W phase at the lowermost stream, and hence when common components are used so that semiconductor modules generating the same amount of heat and having the same heat dissipation performance are used, wastes in cost and size are generated in all the semiconductor modules other than those on the lowermost stream side.

As a countermeasure against this problem, when semiconductor modules generating individual amounts of heat and having individual heat dissipation performances are used so that each semiconductor module is designed to have optimal thermal feasibility, common components cannot be used, which makes a reduction in cost difficult.

In the configuration of Japanese Patent Application Laid-open No. 2007-12722, the U, V, and W phases are arranged in parallel, and hence all the phases have equal thermal feasibility. However, the temperature difference within one heating element is large, and the temperature in the lowermost stream portion of the cooling medium restricts the thermal feasibility of all the semiconductor modules, resulting in a mere expansion of the problems at the lowermost stream of Japanese Patent Application Laid-open No. 2009-296708 to all the semiconductor modules.

On the other hand, the configuration of the present invention, in which, while the U, V, and W phases are arranged in parallel, the heating element 1 in each phase and the heating element 2 in each phase are arranged in series, has both the advantage of Japanese Patent Application Laid-open No. 2007-12722 in that the phases have equal thermal feasibility and the advantage of Japanese Patent Application Laid-open No. 2009-296708 in that the temperature difference in each heating element is small, and at the same time, a thermal feasibility restriction point of the heating element 1 may be set significantly lower than the other configurations.

This allows reduction in cost by reduction in heat transfer area of the heating element 1, simplification of the heat dissipation performance, and the like. On the other hand, in the configuration of the present invention, the thermal feasibility of the heating element 2 is equal to or lower than those of the other configurations. Therefore, the configuration of FIG. 4 is most effective for the combination of the heating element 1, which is not highly heat resistant and has a large effect on cost, and the heating element 2, which is highly heat resistant.

FIG. 5 is an explanatory diagram illustrating, in the electric power converter according to the first embodiment of the present invention, effects of increases in temperature of the cooling medium when heating element generating different amounts of heat are arranged on upper and lower sides of each phase in consideration of thermal interference, in comparison with Japanese Patent Application Laid-open No. 2009-296708 and Japanese Patent Application Laid-open No. 2007-12722.

FIG. 5 illustrates examples in which the heat generating bodies 1 and 2 and heat generating bodies 3 and 4 are mounted on the upper cooling portion and the lower cooling portion of each phase, respectively, and assumes a case where the heat generating bodies 2 and 4 generate smaller amounts of heat than the heat generating bodies 1 and 3, which is an arrangement that takes into consideration the thermal interference between the heat generating bodies 1 and 3, which generate large amounts of heat, and the heat generating bodies 2 and 4, which generate small amounts of heat, as in the example of Japanese Patent Application Laid-open No. 2007-12722. For example, when the heat generating bodies, which generate large amounts of heat, are IGBT elements, and the heat generating bodies, which generate small amounts of heat, are diodes, upper and lower heat generating bodies together constitute one three-phase inverter.

In the configuration of Japanese Patent Application Laid-open No. 2009-296708, the U, V, and W phases are arranged in series, and hence there is an advantage in that the temperature difference within each heating element is small. However, the thermal feasibility of all the heat generating bodies 1 to 4 is determined by the heat generating bodies in the W phase at the lowermost stream, and hence when common components are used so that semiconductor modules generating the same amount of heat and having the same heat dissipation performance are used, wastes in cost and size are generated in all the semiconductor modules other than those on the lowermost stream side.

As a countermeasure against this problem, when semiconductor modules generating individual amounts of heat and having individual heat dissipation performances are used so that each semiconductor module is designed to have optimal thermal feasibility, common components cannot be used, which makes a reduction in cost difficult.

In the configuration of Japanese Patent Application Laid-open No. 2007-12722, the U, V, and W phases are arranged in parallel, and hence all the phases have equal thermal feasibility. In addition, a plurality of the heat generating bodies are arranged in series in one phase, and hence the temperature difference within one heating element is smaller than in the examples of FIG. 4, which still makes no difference to the situation in which the temperature in the lowermost stream portion of the cooling medium restricts the thermal feasibility of all the semiconductor modules.

Moreover, in those examples, as described in Japanese Patent Application Laid-open No. 2007-12722, the heat generating bodies 1 and 3, which generate large amounts of heat, and the heat generating bodies 2 and 4, which generate small amounts of heat, are arrange on upper and lower sides, respectively, in consideration of adverse effects of the thermal interference therebetween. In both examples, in the lower passage, the heating element 3, which generates a large amount of heat, is arranged at the lowermost stream, and the thermal feasibility of the heating element that generates a large amount of heat is the strictest condition of all the heat generating bodies.

On the other hand, in the configuration of the present invention, the heat generating bodies 1 and 3, which have strict thermal feasibility, are arranged on the upstream side of the upper passage with a lower cooling medium temperature, and good thermal feasibility may be obtained. The heat generating bodies 2 and 4, which generate small amounts of heat, are arranged on the downstream side of the lower passage, but their thermal feasibility restriction points are equal to the other examples. The configuration of FIG. 5 is most effective when, for the combination of the heat generating bodes generating different amounts of heat, the heat generating bodies that generate large amounts of heat need to have good thermal feasibility in particular.

As described above, according to the first embodiment, there is provided an electric power converter including: a cooler, which includes a passage through which a cooling medium flows; and at least two heat generating bodies, which are dispersedly arranged on two opposing main surfaces of the cooler to be cooled by the cooler, in which the passage from a cooling medium inlet to a cooling medium outlet of the cooler includes: an upstream cooling portion and a downstream cooling portion for cooling the at least two heat generating bodies; an upstream distribution portion located on the cooling medium inlet side; a downstream distribution portion located on the cooling medium outlet side; a connecting portion for connecting the upstream cooling portion and the downstream cooling portion; and a partition portion for partitioning the upstream cooling portion and the downstream cooling portion, and the upstream distribution portion and the downstream distribution portion, and the passage is connected so that the cooling medium flows in order of the upstream distribution portion, the upstream cooling portion, the connecting portion, the downstream cooling portion, and the downstream distribution portion.

Therefore, the electric power converter that costs low and has an excellent cooling performance may be obtained.

Note that, in the electric power converter 1 according to the first embodiment described above, it can be contemplated to set an allowable temperature of the heating element 22, which is mounted on the downstream cooling portion 14, higher than an allowable temperature of the heating element 21, which is mounted on the upstream cooling portion 13.

In such configuration, the upstream cooling portion 13 has a lower cooling medium temperature and better thermal feasibility than the downstream cooling portion 14. Therefore, in a case where there is a difference between the allowable temperatures of the heat generating bodies, when a component having a lower allowable temperature and a component having a higher allowable temperature are arranged on the upstream side and the downstream side, respectively, the component having the lower allowable temperature may be cooled by the upstream cooling portion 13 with the lower cooling medium temperature, with the result that even when the cooling medium is increased in temperature by the component on the upstream side, the component on the downstream side is not affected and performances of the respective component may be sufficiently exerted (see FIG. 4 and second and third embodiments to be described later).

Further, in the electric power converter 1 according to the first embodiment described above, it can be contemplated to use a wide bandgap semiconductor as the heating element 22 to be mounted on the downstream cooling portion 14.

In general, a switching element for use in an electric power converter such as an inverter or a converter is often mainly made of silicon, and an allowable upper limit temperature of the switching element is about 125° C. to 175° C. Meanwhile, in recent years, there have been introduced a wide bandgap semiconductor having an allowable upper limit temperature of 200° C. or more, and diodes and the like have been commercialized.

When a switching element mainly made of silicon having a temperature limit of about 125° C. to 175° C. and a diode made of a wide bandgap semiconductor having a temperature limit of 200° C. or more are combined to construct an inverter, or when an inverter using a semiconductor element mainly made of silicon and an inverter or a converter using a wide bandgap element are combined to construct one electric power converter, the difference in temperature limit between the semiconductor element mainly made of silicon and the wide bandgap element becomes a problem.

However, in the configuration of the present invention, through the arrangement of the semiconductor element mainly made of silicon and the wide bandgap element respectively on the upstream cooling portion 13 having good thermal feasibility and on the downstream side with the high cooling medium temperature, the electric power converter 1 may be constructed without adversely affecting the thermal feasibility of the semiconductor element mainly made of silicon (see the second and third embodiments to be described later).

Further, in the electric power converter 1, it can be contemplated to use silicon carbide, a gallium nitride-based material, or diamond as the wide bandgap semiconductor.

Wide bandgap semiconductors made of silicon carbide, gallium nitride, or a diamond have been introduced, and when a wide bandgap semiconductor using any of those materials is used, a temperature limit that is higher than that of a semiconductor mainly made of silicon may be obtained (see the second and third embodiments to be described later).

Further, in the electric power converter 1 according to the first embodiment described above, it can be contemplated to set the amount of heat generated by the heating element 21, which is mounted on the upstream cooling portion 13, larger than the amount of heat generated by the heating element 22, which is mounted on the downstream cooling portion 14.

In such configuration, the upstream cooling portion 13 has a lower cooling medium temperature and better thermal feasibility than the downstream cooling portion 14. Therefore, in the case where there is a difference between the amounts of generated heat of the heat generating bodies, when a component generating a larger amount of heat and a component generating a smaller amount of heat are arranged on the upstream side and the downstream side, respectively, good thermal feasibility of the component generating the larger amount of heat may be maintained, with the result that the component that has a large effect on the product in terms of both size and cost may be reduced in size and cost (see FIG. 5 and the second and third embodiments to be described later).

Further, in the electric power converter 1 according to the first embodiment described above, it can be contemplated to use a switching element as the heating element 21 to be mounted on the upstream cooling portion 13.

In such configuration, the upstream cooling portion 13 has a lower cooling medium temperature and better thermal feasibility than the downstream cooling portion 14. In general, an electric power converter such as an inverter or a converter includes a switching element such as an IGBT and a diode as a free wheel element. When the IGBT with a switching function and the diode without the switching function are compared, the switching element has a more complicated structure and costs higher.

Therefore, the arrangement of the switching elements on the upstream cooling portion 13, which has the low cooling medium temperature and is advantageous for the thermal feasibility, is effective in reducing the size of the switching element, which costs higher, and hence the cost of the apparatus may be reduced (see the configuration of the present invention in FIG. 5).

Further, when the switching elements are arranged on the upstream cooling portion 13, in the configuration of the present invention, the switching elements are arranged in a concentrated manner on one surface of the cooler 10, and hence a control board 30 for driving the switching elements may be provided proximate to signal terminals 40. FIG. 6 is an explanatory diagram illustrating, in the electric power converter 1 according to the first embodiment of the present invention, an example of a case where the switching elements are arranged on the upstream cooling portion.

In Japanese Patent Application Laid-open No. 2007-12722, the lower switching elements are connected to the control board arranged on the upper side through long signal terminals. However, when the switching elements and the control board 30 are provided in proximity, a malfunction due to noise may also be avoided, and the simpler structure than in Japanese Patent Application Laid-open No. 2007-12722 allows reductions in size and cost in addition to the improvement in noise immunity (see FIG. 6 and the second embodiment to be described later).

Further, in the electric power converter 1 according to the first embodiment described above, it can be contemplated to use a converter for controlling a supply voltage as the heating element 22 to be mounted on the downstream cooling portion 14.

In a hybrid electric vehicle that uses an internal combustion engine and a motor in combination for driving, in order to reduce the size of the motor for power generation by means of an electric power converter for controlling a motor for driving the vehicle as well as the motor for driving the vehicle and the internal combustion engine and to increase the efficiency of the vehicle system, a bus voltage of the electric power converter for controlling the motor for driving the vehicle is stepped up or down by a voltage converter such as a DC-DC converter or the like in some cases (see Japanese Patent Application Laid-open No. 2009-296708).

The voltage converter for stepping up or down the voltage often uses a reactor as energy exchange means. The reactor includes a magnetic material and a conductor and is very large in both mass and capacity, and hence when the reactor is reduced in size, the electric power converter may be reduced in size and weight.

In order to reduce the size of the reactor, an increase in switching frequency is effective, and it is desired to apply a wide bandgap semiconductor, which is easy to increase the frequency. The wide bandgap semiconductor is highly heat resistant and hence may be mounted on the downstream cooling portion 14. On the other hand, the reactor generates heat and needs to be cooled, but because the amount of heat generated by the reactor is smaller than the semiconductor modules used in the electric power converter for controlling the motor for driving the vehicle, it is desired that the reactor be mounted on the downstream cooling portion 14.

As a result, the arrangement of the semiconductor module, which is used in the voltage converter, and the reactor on the downstream cooling portion 14 is suitable for their respective amounts of generated heat and heat resistance, and at the same time, allows proximate arrangement of the semiconductor module and the reactor so that a circuit member and the like for connecting the semiconductor module and the reactor may be reduced, and hence the electric power converter 1 may be reduced in size and cost (see the third embodiment to be described later).

Further, in the electric power converter 1 according to the first embodiment described above, it can be contemplated to use a semiconductor module used in a power converter for controlling the motor for driving the vehicle as the heating element 21 to be mounted on the upstream cooling portion 13.

In a vehicle such as an electric vehicle or a hybrid electric vehicle, power converters of various sizes such as power sources for driving an air conditioner and an auxiliary machine need to be mounted in addition to the power converter for controlling the motor for driving the vehicle, but in order to be housed in a limited space such as an engine room, the power converters of various sizes need to be integrated into one electric power converter to be reduced in size.

Of the various power converters to be mounted in one electric power converter, the power converter for controlling the motor for driving the vehicle, which controls driving of the vehicle, is of highest priority. Therefore, when the semiconductor module used in the power converter for controlling the motor for driving the vehicle is mounted on the upstream cooling portion 13 in the configuration of the present invention, the semiconductor module is cooled in precedence to the air conditioner and the auxiliary machine even under a bad condition in which an environmental temperature or the cooling medium temperature is high, and hence the vehicle may be driven more continuously (see the third embodiment to be described later).

Further, in the electric power converter 1 according to the first embodiment described above, it can be contemplated to make a passage cross sectional area of the connecting portion 17 and passage cross sectional areas of the upstream cooling portion 13 and the downstream cooling portion 14 substantially equal.

In such configuration, the connecting portion 17 is added as compared to the configuration of Japanese Patent Application Laid-open No. 2007-12722, and hence a reduction in pressure loss of the connecting portion 17 is required. When the passage cross sectional area of the connecting portion 17 and the passage cross sectional areas of the cooling portions 13 and 14 are different, an enlargement loss and a contraction loss occur in portions in which the passage cross sectional area is increased and decreased rapidly, respectively, and hence an unnecessary pressure loss occurs.

Figure 7:
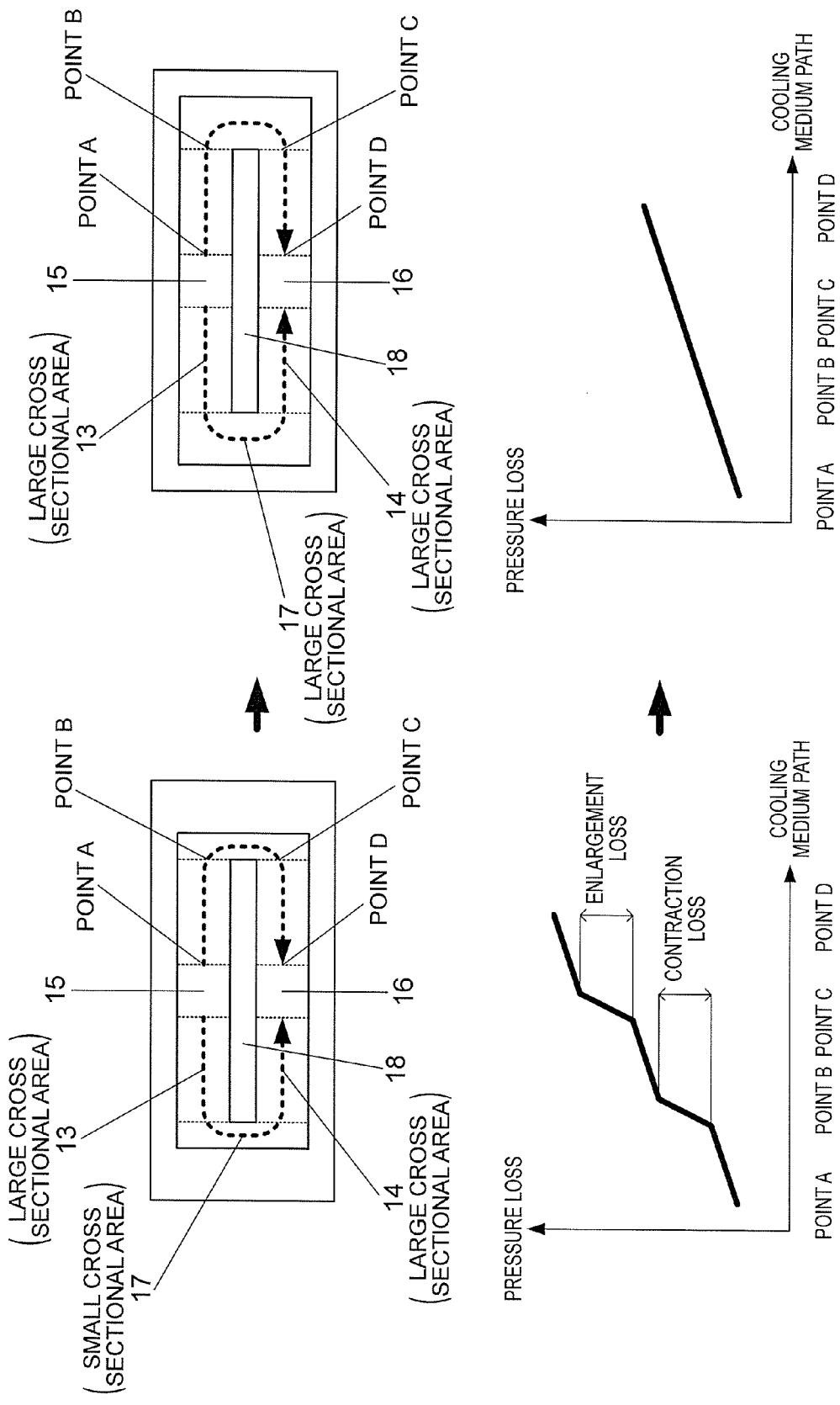
FIG. 7 is an explanatory diagram illustrating a configuration in which cooling portions and a connecting portion are coupled in the electric power converter according to the first embodiment of the present invention.

To address this problem, when the passage cross sectional area of the connecting portion 17 coupled to the upstream and downstream cooling portions is made substantially equal to those of the cooling portions 13 and 14 as illustrated in FIG. 7, the enlargement loss and the contraction loss do not occur, and a pressure loss due to the addition of a connecting portion and a reduction in cooling performance resulting therefrom may be minimized (see FIG. 7 and the second embodiment to be described later). FIG. 7 is an explanatory diagram illustrating a configuration in which the cooling portions 13 and 14 and the connecting portion 17 are coupled in the electric power converter 1 according to the first embodiment of the present invention.

Further, in the electric power converter 1 according to the first embodiment described above, it can be contemplated to reduce a passage cross sectional area of the upstream distribution portion 15 farther from the cooling medium inlet 11 side, and increase a passage cross sectional area of the downstream distribution portion 16 closer to the cooling medium outlet 12 side.

The upstream distribution portion 15 and the downstream distribution portion 16 are passages also included in Japanese Patent Application Laid-open No. 2007-12722, and the configuration of the present invention does not increase the pressure loss significantly. However, in the configuration of the present invention, the upstream distribution portion 15 and the downstream distribution portion 16 are arranged in a stacked manner with the interposition of the partition portion 18, and hence in order to reduce the height of the cooler 10 and hence the height of the electric power converter 1, the upstream distribution portion 15 and the downstream distribution portion 16 need to be reduced in height.

FIG. 8 is an explanatory diagram illustrating a reduction in height of the distribution portions 15 and 16 in the electric power converter 1 according to the first embodiment of the present invention. In FIG. 8, in the upstream distribution portion 15, the cooling medium is branched to the upstream cooling portions 13 farther from the cooling medium inlet 11 side, and hence the flow rate of the upstream distribution portion 15 is reduced farther from the cooling medium inlet 11 side. In other words, even when the passage cross sectional area of the upstream distribution portion 15 is reduced farther from the cooling medium inlet 11 side, the pressure loss of the upstream distribution portion 15 is not increased.

Similarly, in the downstream distribution portion 16, the cooling medium merges from the downstream cooling portions 14 closer to the cooling medium outlet 12 side, and hence the flow rate of the downstream distribution portion 16 is increased closer to the cooling medium outlet 12 side. In other words, when the passage cross sectional area of the downstream distribution portion 16 is increased closer to the cooling medium outlet 12 side, the pressure loss of the downstream distribution portion 16 is not increased.

When the cooling medium inlet 11 and the cooling medium outlet 12 are arranged opposed to each other, the part of the upstream distribution portion 15 having the large cross sectional area and the part of the downstream distribution portion 16 having the small cross sectional area are arranged in a stacked manner, and the part of the upstream distribution portion 15 having the small cross sectional area and the part of the downstream distribution portion 16 having the large cross sectional area are arranged in a stacked manner, with the result that the height of the upper and lower distribution portions may be halved without increasing the pressure losses of the distribution portions 15 and 16.

When the reductions in height of the distribution portions 15 and 16 are achieved, not only the cooler 10 is reduced in height, which leads to the reduction in size of the electric power converter 1, but also the path length of the passage of the connecting portion 17, which is proportional to the height of the cooler 10, may be reduced, and hence the increase in pressure loss of the cooler 10 due to the adoption of the configuration of the present invention may also be reduced (see FIG. 8 and the second and third embodiments to be described later).

Further, in the electric power converter 1 according to the first embodiment described above, it can be contemplated to constitute the cooler 10 of the cooling fins integrated with heating element mounting plates and a passage housing integrated with the partition portion 18. In this case, a through hole formed in the partition portion 18 constitutes the connecting portion 17, a concavity and convexity formed in the partition portion 18 constitutes the upstream distribution portion 15 and the downstream distribution portion 16, and at least one of the cooling fins integrated with the heating element mounting plates and the passage housing integrated with the partition portion 18 are bonded by welding or brazing.

In the cooler 10 of the present invention, the distribution portion 15 and the cooling portion 13 on the upstream side and the distribution portion 16 and the cooling portion 14 on the downstream side are arranged in a stacked manner with the interposition of the partition portion 18 and the connecting portion 17, and in order to construct a passage, the passage housing needs to be processed from above and below. In particular, in order to realize the configurations illustrated in FIGS. 7 and 8, a configuration in which the passage housing may be processed arbitrarily from above and below without any processing constraints needs to be adopted.

Figure 9:
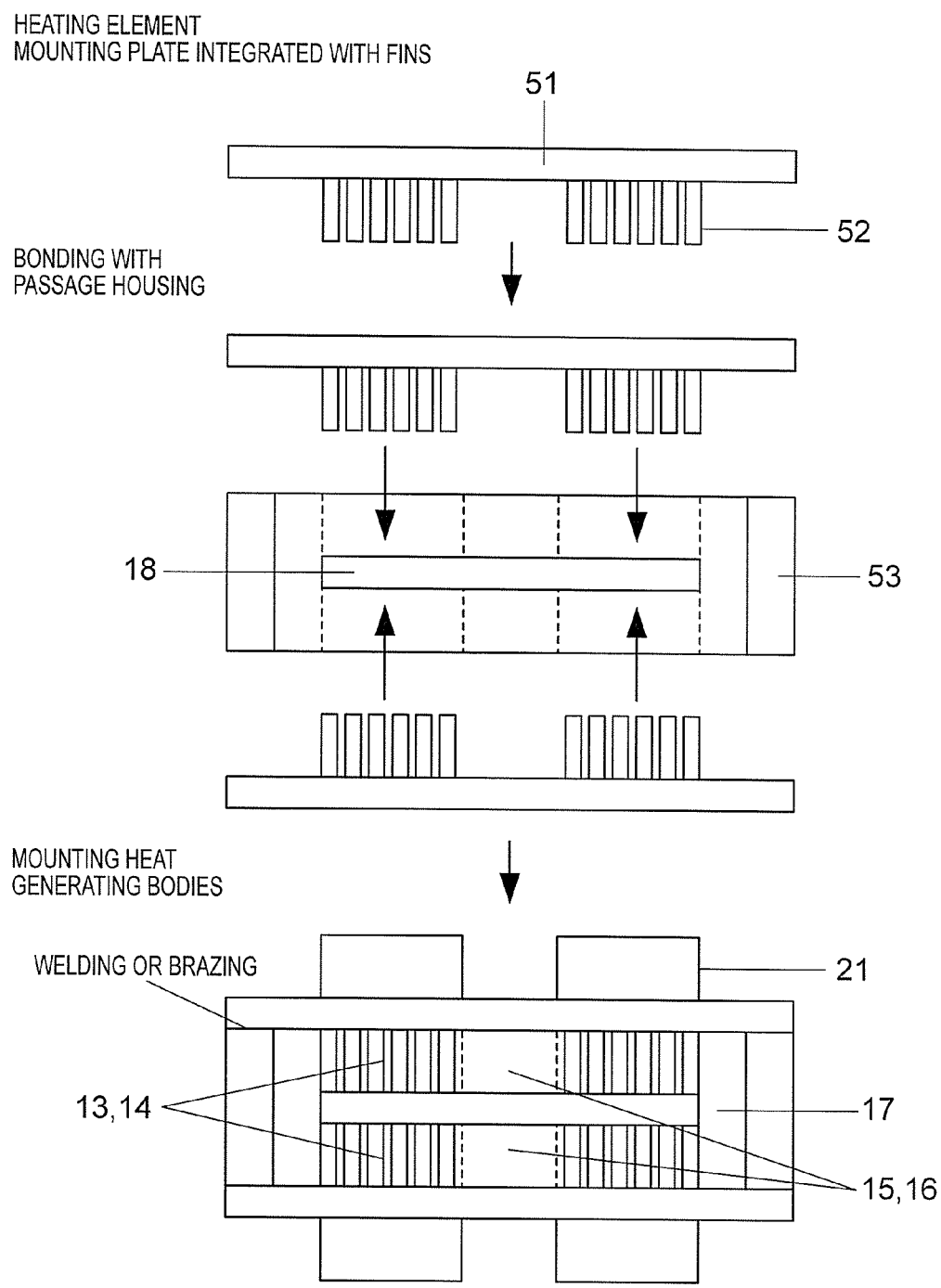
FIG. 9 is an explanatory diagram illustrating, in the electric power converter according to the first embodiment of the present invention, the cooler including cooling fins integrated with heating element mounting plates and a passage housing integrated with a partition plate.

FIG. 9 is an explanatory diagram illustrating, in the electric power converter 1 according to the first embodiment of the present invention, the cooler 10 including cooling fins 52 integrated with heating element mounting plates 51 and a passage housing 53 integrated with the partition portion 18.

In the configuration of FIG. 9, the passage housing 53 integrated with the partition portion 18 is processed from both the upper and lower directions to construct the shapes of the connecting portion 17 and the distribution portions 15 and 16 arbitrarily, and then the cooling fins 52 integrated with the heating element mounting plates 51 are bonded above and below the passage housing 53 afterward, to thereby constitute a passage that is sealed except for the cooling medium inlet 11 and the cooling medium outlet 12.

In this configuration, the passage housing 53 and the heating element mounting plates 51 are different members, and hence a leakage of the cooling medium from a bond part between the passage housing 53 and the heating element mounting plate 51 becomes a problem. Especially in the configuration of the present invention, the heat generating bodies 21 and 22 are mounted on both surfaces of the cooler 10, and hence the bond part between the passage housing 53 and the heating element mounting plate 51 exists in the upper and lower parts of the cooler 10.

Therefore, in a case where the cooling medium is a liquid, when a leakage occurs from the bond part between the passage housing 53 and the heating element mounting plate 51 in the lower part of the cooler 10, the cooling medium is leaked and a serious damage such as immersion of the lower heating element 22 in the cooling medium may occur. Therefore, through bonding of the heating element mounting plate 51 continuously by welding or brazing, a more reliable countermeasure against leakage than an O-ring or a liquid packing material may be provided.

Further, in the configuration of the present invention, on the lower side of the cooler 10 that is greatly affected by the leakage of the cooling medium, the heating element 22 having a high temperature due to high heat resistance may be mounted, and hence metal-based sealing means such as welding or brazing is used instead of resin-based sealing means such as the O-ring or the liquid packing to realize high heat resistance of the sealing material.

Note that, the bonding by welding or brazing may be performed only on the lower side that may be seriously damaged by the leakage of the cooling medium, or may be performed only on the downstream side where the cooling medium temperature becomes high. Further, for parts that are not greatly damaged by the water leakage or the upstream side where the cooling medium temperature is low, the sealing may be made by means of the O-ring, the liquid packing, or the like (see FIG. 9 and the third embodiment to be described later).

Further, it can be contemplated that the electric power converter has a configuration in which the cooling fins 52 integrated with the heating element mounting plate 51 are mainly made of aluminum and processed by extrusion, and then the surface on which the heat generating bodies 21 and 22 are not mounted is processed by cutting or forging so that parts of the heat generating bodies 21 and 22 are arranged on a plane including at least one of the connecting portion 17, and the upstream distribution portion 15 and the downstream distribution portion 16, and so that the at least one of the connecting portion 17, and the upstream distribution portion 15 and the downstream distribution portion 16 also has a part of a function of the upstream cooling portion 13 and the downstream cooling portion 14.

Figure 10:
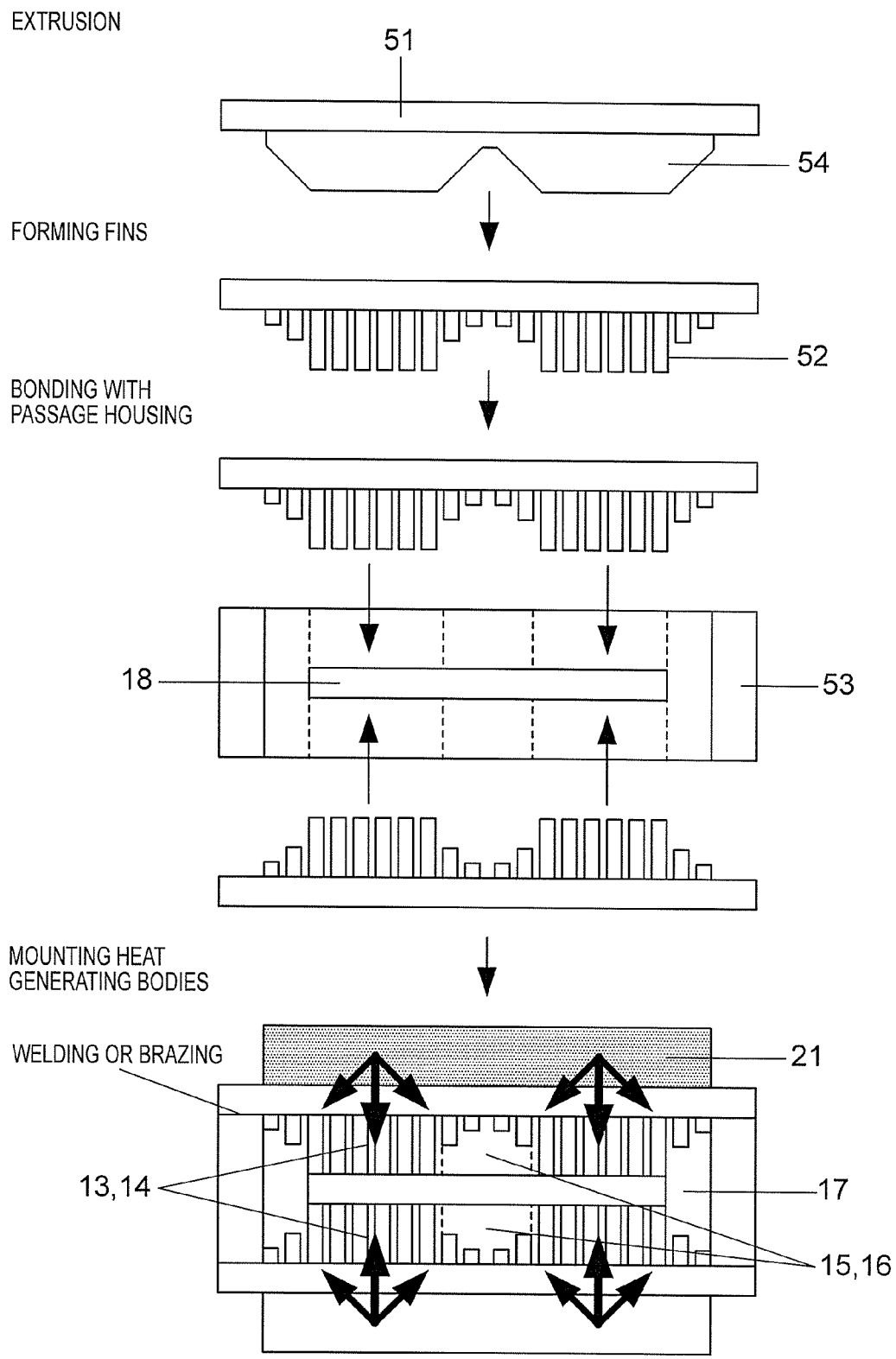
FIG. 10 is an explanatory diagram illustrating, in the electric power converter according to the first embodiment of the present invention, the cooler in which the distribution portions and the connecting portion also have a part of a function of the cooling portions.

FIG. 10 is an explanatory diagram illustrating, in the electric power converter according to the first embodiment of the present invention, the cooler 10 in which the distribution portions 15 and 16 and the connecting portion 17 also have a part of the function of the cooling portions 13 and 14. In the configuration of FIG. 10, the distribution portions 15 and 16 and the connecting portions 17 are arranged at substantially the center and at substantially both ends of the cooler 10, respectively, and when the cooler 10 is reduced in size as much as possible in mounting a large-sized heating element or a plurality of heat generating bodies, the distribution portions 15 and 16 and the connecting portion 17 may interfere with heating element mounting portions, that is, the cooling portions 13 and 14. The distribution portions 15 and 16 and the connecting portion 17 need to have as large cross sectional area as possible in order to reduce the pressure loss.

On the other hand, to the cooling portions 13 and 14 on which the heat generating bodies are arranged, the cooling fins 52 need to be constructed in order to secure a heat dissipation performance of the heat generating bodies 21 and 22, and when the heating element mounting portions interfere with the distribution portions 15 and 16 and the connecting portion 17, both securement of the heat dissipation performance as the cooling portions 13 and 14 and low pressure loss as the connecting portion 17 and the distribution portions 15 and 16 need to be attained.

Therefore, the cooling fins 52 integrated with the heating element mounting plates 51 are processed by extrusion along the direction in which the cooling medium flows through the distribution portions 15 and 16 to form main cross sectional shapes of the cooling fins 52, and then the cooling fin portions are processed by cutting or forging to increase a heat dissipation area. In this manner, the cooling fins 52 are formed in parts of the distribution portions 15 and 16 and the connecting portion 17 which are close to the heat generating bodies 21 and 22 and of which a large amount of heat transfer can be expected, to thereby realize a high heat dissipation performance.

Further, the cooling fins 52 are not formed in parts that are far from the heat generating bodies 21 and 22 and of which a large amount of heat transfer cannot be expected, to thereby realize a high performance as the distribution portions 15 and 16 and the connecting portion 17 with a low pressure loss. With this configuration, both the function as the cooling portions 13 and the functions as the connecting portion 17 and the distribution portions 15 and 16 may be attained.

By the extrusion processing along the direction of the cooling medium in the distribution portions 15 and 16, a high heat dissipation property as the cooling fins 52 and low pressure losses as the distribution portions 15 and 16 and the connecting portion 17 may be realized. However, the material after the extrusion processing is not formed with a passage in the direction in which the cooling medium flows through the cooling portions 13 and 14 and that is perpendicular to the direction in which the cooling medium flows through the distribution portions 15 and 16, and hence the material does not function as the cooling fins 52. Therefore, a cylindrical or conic shape or a prismatic or square pyramidal shape is formed by cutting or forging to form the cooling fins 52 having a wide heat dissipation area. In this manner, both a high heat dissipation property of the cooling portions 13 and 14 and low pressure losses of the distribution portions 15 and 16 and the connecting portion 17 are attained.

Further, with the use of aluminum as a main material, high extrusion processability as well as high corrosion resistance may be secured, and further, high bondability with the passage housing 53, which is mainly made of aluminum for main reasons of weight reduction, processability, degree of freedom in shape, and the like may be secured to increase the reliability of the sealing and reduce the possibility of occurrence of the leakage of the cooling medium (see FIG. 10 and the third embodiment to be described later).

Further, in the electric power converter 1 according to the first embodiment described above, it can be contemplated that the cooler 10 includes the heating element mounting plates, the cooling fins, and the partition portion 18. In this configuration, the through hole formed in the partition portion 18 constitutes the connecting portion 17, and the heating element mounting plates, the cooling fins, and the partition portion 18 are bonded by brazing to constitute a part of the passage.

In the configuration of FIG. 10, the upper and lower cooling fins 52 made of extruded materials 54 integrated with the heating element mounting plates 51 and the passage housing 53 integrated with the partition portion 18 are bonded. When the cooling fins 52 integrated with the heating element mounting plates 51 is formed by extrusion processing, due to constraints of the extrusion processing that make a thin plate difficult to form, it has been difficult to reduce thicknesses of the heating element mounting plates 51 and the cooling fins 52.

Further, the passage housing 53 when integrated with the partition portion 18 has also been difficult to reduce in thickness due to constraints of casting. When those members are combined, the thickness of the cooler 10 is increased to make a reduction in height of the electric power converter 1 difficult, and further, the path length of the passage of the connecting portion 17 is increased, which may lead to an unnecessary increase in pressure loss that does not contribute to the heat dissipation performance of the cooling portions 13 and 14.

Thus, when the respective members are manufactured by extrusion processing or casting, it is difficult to reduce the thickness of the components due to the processing constraints, and hence when it is important to reduce the height, the heating element mounting plates 51, the cooling fins 52, and the partition portion 18 are formed as separate members by pressing or the like and thereafter bonded to be integrated by brazing, to thereby construct the passage.

Figure 11:
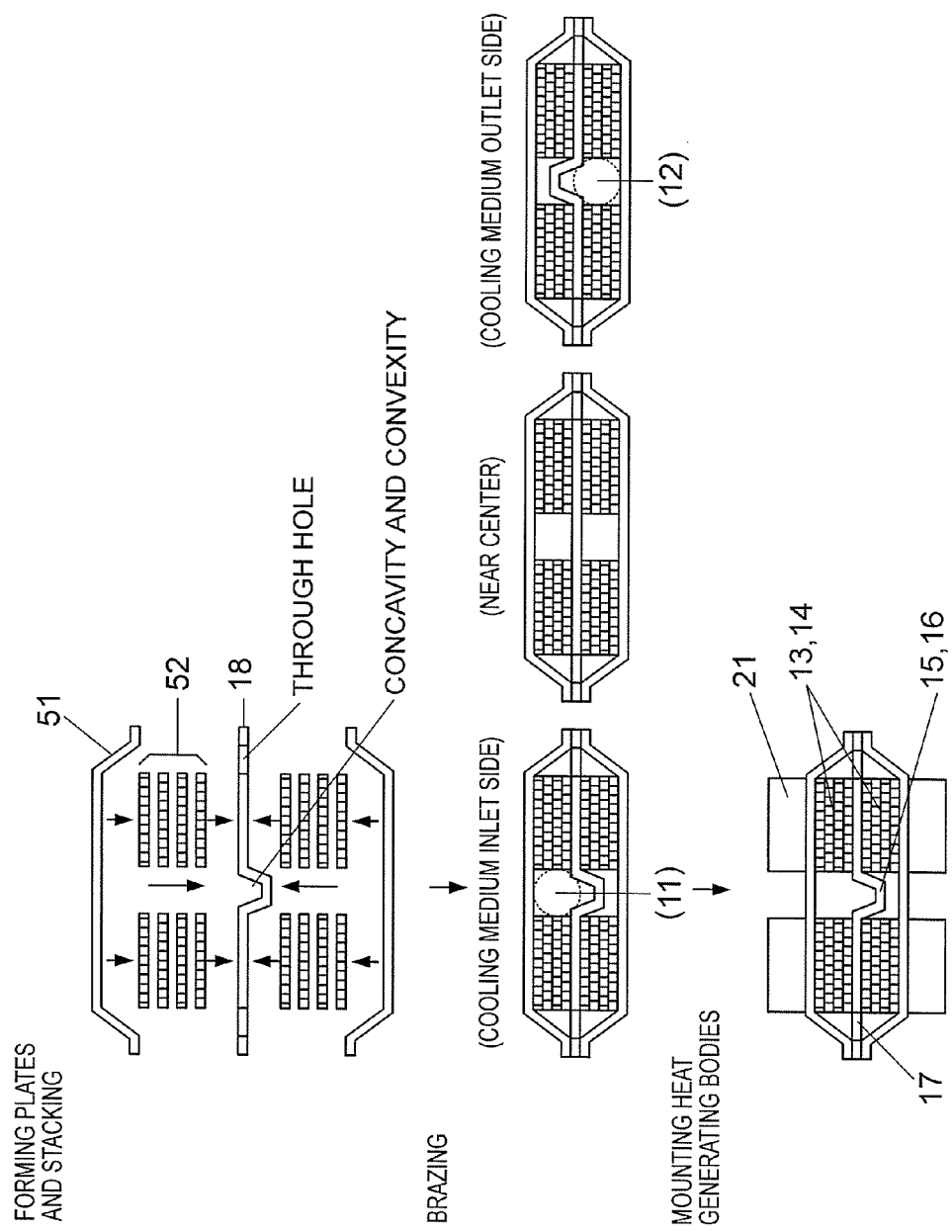
FIG. 11 is an explanatory diagram illustrating, in the electric power converter according to the first embodiment of the present invention, the cooler in which the heating element mounting plates, the cooling fins, and the partition plate are separately formed and bonded by brazing.

FIG. 11 is an explanatory diagram illustrating, in the electric power converter 1 according to the first embodiment of the present invention, the cooler 10 in which the heating element mounting plates 51, the cooling fins 52, and the partition portion 18 are separately formed and bonded by brazing.

In FIG. 11, by constructing the heating element mounting plates 51, the cooling fins 52, and the partition portion 18 as separate members, the heating element mounting plates 51 may be formed as a thin member having a thickness that is necessary to mount the heat generating bodies 21 and 22 without the processing constraints in forming the cooling fins. Further, the cooling fins 52 are subjected to pressing to constitute a large number of fine passages so that a large heat dissipation area may be secured with a small thickness, and hence both the reduction in height and high heat dissipation performance may be attained. Further, the partition portion 18 may be subjected to pressing so as to easily realize the shape of the connecting portion illustrated in FIG. 7 and the shapes of the distribution portions illustrated in FIG. 8.

Further, when those members are bonded and integrated by brazing, metal-based sealing means may be used without using resin-based sealing means such as the O-ring or the liquid packing, which has a problem in heat resistance, for the bond part with a risk of a leakage of the cooling medium, which is advantageous for the configuration of the present invention in which the heat generating bodies 21 and 22 having a high temperature due to high heat resistance may be mounted (see FIG. 11 and the second embodiment to be described below).

Second Embodiment

Figure 12:
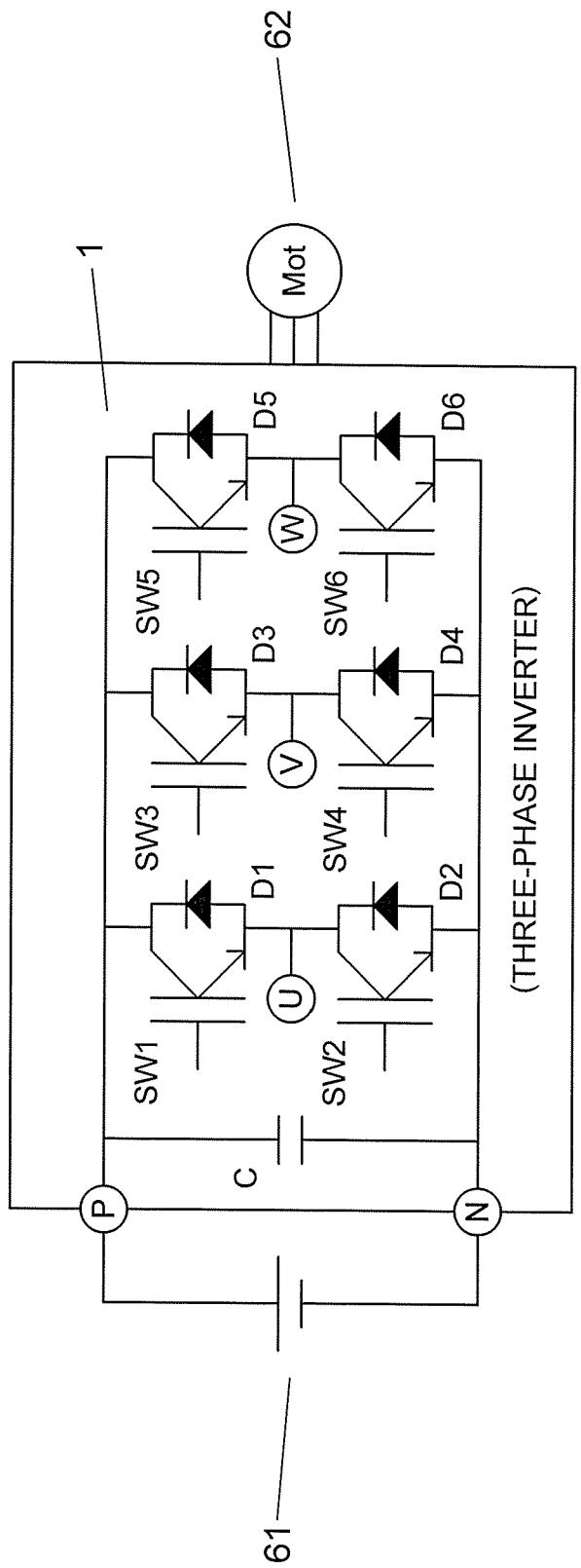
FIG. 12 is a configuration diagram illustrating a main circuit of an electric power converter according to a second embodiment of the present invention, along with peripheral devices.

FIG. 12 is a configuration diagram illustrating a main circuit of an electric power converter 1 according to the second embodiment of the present invention, along with peripheral devices (a DC power source 61 and a motor generator 62). In FIG. 12, the electric power converter 1 is a three-phase inverter including switching elements SW1 to SW6 and free wheel elements D1 to D6, and is, for example, an electric power converter for use in an electric vehicle or a one-motor hybrid electric vehicle.

Next, a configuration of a cooling medium passage of a cooler 10 and arrangement of heat generating bodies of the electric power converter 1 according to the second embodiment of the present invention are as illustrated in FIG. 6 described above. In FIG. 6, the cooling medium passage of the cooler 10 of the electric power converter 1 is coupled in order of the cooling medium inlet 11, the upstream distribution portion 15, the upstream cooling portion 13, the connecting portion 17, the downstream cooling portion 14, the downstream distribution portion 16, and the cooling medium outlet 12.

On the upstream cooling portion 13, the switching elements SW1 to SW6 are mounted as the heating element 21, and on the downstream cooling portion 14, the free wheel elements D1 to D6 are mounted. In other words, the switching elements, which generate a large amount of heat and have a large effect on cost, are mounted on the upstream cooling portion 13, and the free wheel elements, which generate a small amount of heat and have a small effect on cost, are mounted on the downstream cooling portion 14.

Figure 13A:
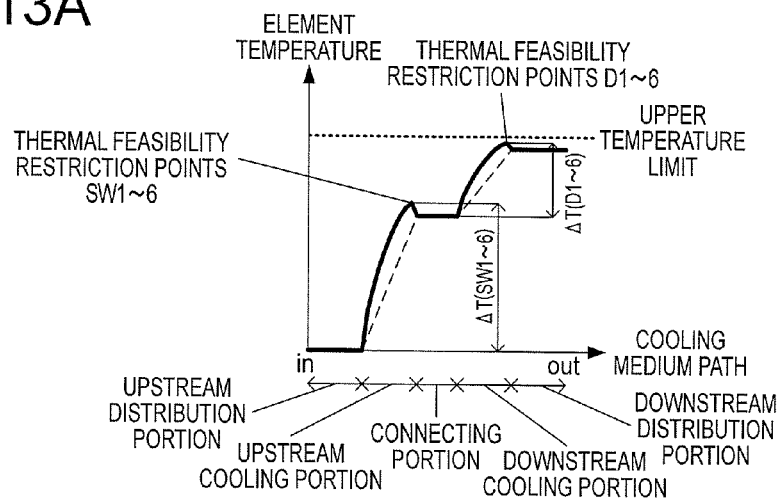
FIGS. 13A to 13C are explanatory diagrams of increases in temperature of a cooling medium in the electric power converter according to the second embodiment of the present invention.
Figure 13B:
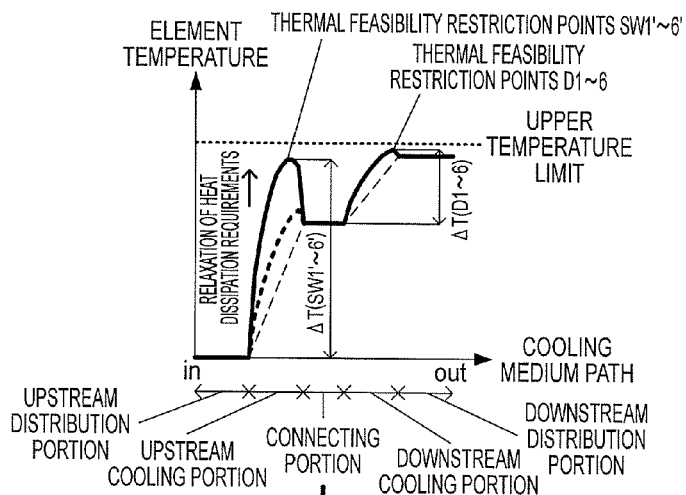
Figure 13C:
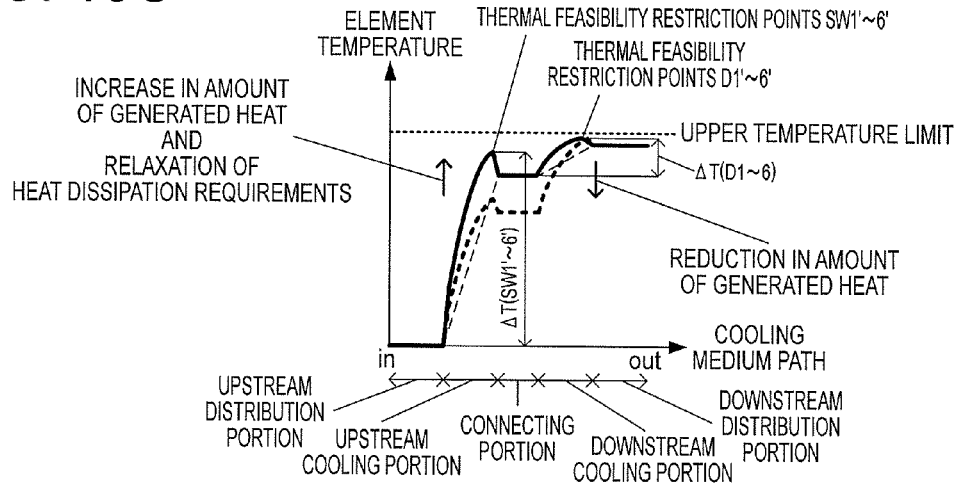

FIGS. 13A to 13C are explanatory diagrams illustrating, in the electric power converter 1 according to the second embodiment of the present invention, increases in temperature of a cooling medium due to the passage configuration and the arrangement of the heat generating bodies. With the passage configuration and the arrangement of the heat generating bodies of the second embodiment, the switching elements on the upstream side are cooled by the cooling medium having the lowest temperature, and hence are highly thermally feasible.

The free wheel elements on the downstream side are cooled by the cooling medium that is increased in temperature by the switching elements on the upstream side, but in the configuration of the second embodiment, the free wheel elements arranged on the downstream side generate a smaller amount of heat than the switching elements and have no problem in the thermal feasibility.

It should be noted, however, that when there is a significant difference in thermal feasibility between the switching elements on the upstream side and the free wheel elements on the downstream side as in FIG. 13A, heat dissipation requirements of the switching elements having ample thermal feasibility may be relaxed as in FIG. 13B. In other words, a material having low thermal conductivity may be used for the heat dissipation path of the switching elements or the heat dissipation area may be reduced, which allows reductions in cost and size of the semiconductor module and the cooler 10, and hence allows reductions in cost and size of the electric power converter 1.

In addition, when the amount of heat generated by the free wheel elements on the downstream side may be reduced as in FIG. 13C, the amount of heat generated by the switching elements on the upstream side may be increased accordingly. When the relaxation of the heat dissipation requirements and the increase in amount of generated heat may be attained simultaneously, the area of the switching elements may be reduced, which allows a reduction in cost through a reduction in size of the switching elements, which in turn allows reductions in size and cost of peripheral components, and hence larger effects than in the case of FIG. 13B may be obtained.

Figure 14:
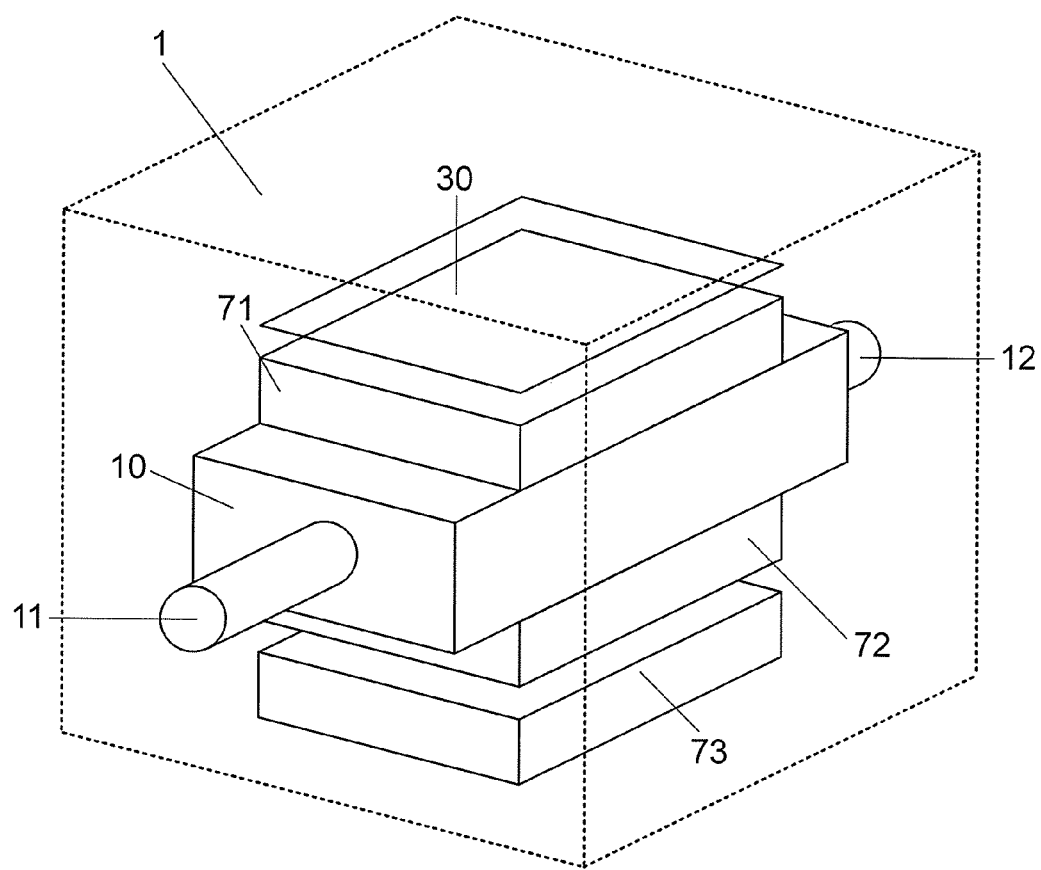
FIG. 14 is a perspective view illustrating the electric power converter according to the second embodiment of the present invention.
Figure 15:
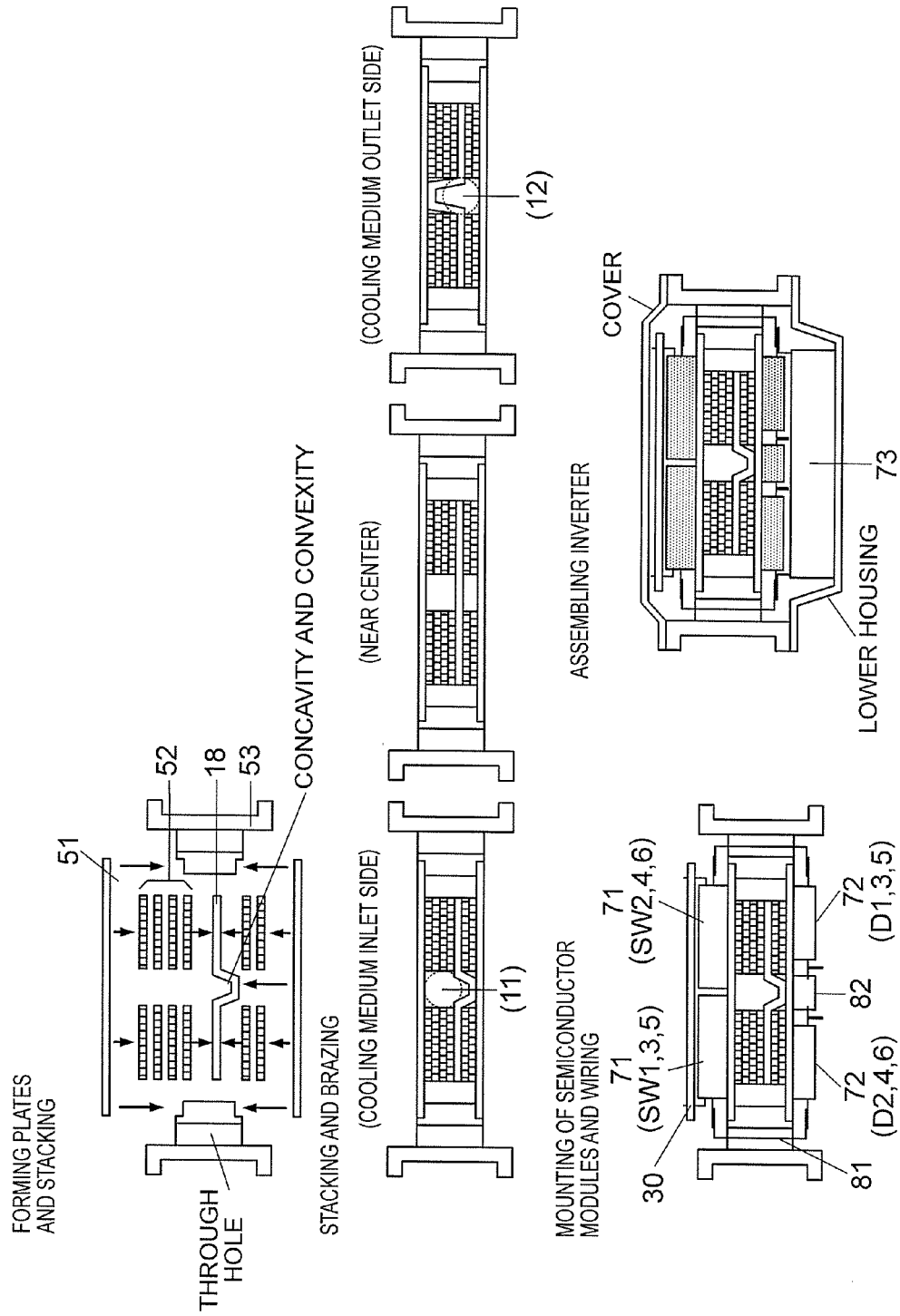
FIG. 15 is a configuration diagram illustrating a cooler in the electric power converter according to the second embodiment of the present invention.

Next referring to FIGS. 14 and 15, structure of the electric power converter 1 according to the second embodiment of the present invention is described. FIG. 14 is a perspective view illustrating the electric power converter 1 according to the second embodiment of the present invention. FIG. 15 is a configuration diagram illustrating the cooler 10 in the electric power converter 1 according to the second embodiment of the present invention.

The electric power converter 1 according to the second embodiment of the present invention includes, as illustrated in FIG. 14, a semiconductor module 71 including the switching elements SW1 to SW6 above the cooler 10, and a semiconductor module 72 including the free wheel elements D1 to D6 below the cooler 10. The electric power converter 1 also includes a smoothing capacitor 73 below the semiconductor module 72 including the free wheel elements, and a control board 30 above the semiconductor module 71 including the switching elements. The electric power converter 1 further includes the cooling medium inlet 11 on a surface of the cooler 10 on which the semiconductor modules 71 and 72 are not mounted, and the cooling medium outlet 12 on a surface opposed to the surface including the cooling medium inlet 11.

In the cooler 10 of the electric power converter 1 according to the second embodiment of the present invention, as illustrated in FIG. 15, heating element mounting plates 51, cooling fins 52, and a partition portion 18 are formed as separate members by pressing or the like and thereafter bonded by brazing to a passage housing 53, which is formed by casting, to be integrated together and thereby constitute a passage.

In FIG. 15, by constructing the heating element mounting plates 51, the cooling fins 52, and the partition portion 18 as separate members, the heating element mounting plates 51 may be formed as a thin member having a minimum thickness that is necessary to mount the heat generating bodies 21 and 22 without processing constraints in forming the cooling fins.

Further, the cooling fins 52 are subjected to pressing to constitute a large number of fine passages so that a large heat dissipation area may be secured with a small thickness, and hence both a reduction in height and high heat dissipation performance may be attained. Further, the partition portion 18 is formed by pressing with a concave and convex shape, with which the upstream distribution portion 15 has a larger passage cross sectional area on the cooling medium inlet 11 side and a smaller passage cross sectional area toward the cooling medium outlet 12 side.

With this configuration, the passage cross sectional areas of the distribution portions 15 and 16 vary depending on the position, but as illustrated in FIG. 8, in the upstream distribution portion 15, the cooling medium is branched to the upstream cooling portions 13 farther from the cooling medium inlet 11 side, and hence the flow rate of the upstream distribution portion 15 is reduced farther from the cooling medium inlet 11 side. In other words, even when the passage cross sectional area of the upstream distribution portion 15 is reduced farther from the cooling medium inlet 11 side, the pressure loss of the upstream distribution portion 15 is not increased.

Similarly, in the downstream distribution portion 16, the cooling medium merges from the downstream cooling portions 14 closer to the cooling medium outlet 12 side, and hence the flow rate of the downstream distribution portion 16 is increased closer to the cooling medium outlet 12 side. In other words, when the passage cross sectional area of the downstream distribution portion 16 is increased closer to the cooling medium outlet 12 side, the pressure loss of the downstream distribution portion 16 is not increased.

Further, with this shape, the flow rate is evenly distributed from the distribution portions 15 and 16 to the cooling portions 13 and 14, with the result that the flow rates of the cooling portions 13 and 14 are made uniform and the heat dissipation performance may also be made uniform. In the configuration of the second embodiment, the U, V, and W phases of the three-phase inverter are arrayed from the cooling medium inlet 11 to the cooling medium outlet 12 to operate with only a phase shift of 120°, and hence desirably have uniform heat dissipation performance, to which the shapes of the distribution portions 15 and 16 in the second embodiment are suitable.

If a plurality of the electric power converter 1 are mounted or there is a difference in required heat dissipation performance, the concave and convex shape may be changed so that the passage cross sectional area of the distribution path to a part where a required heat dissipation performance is low may be reduced to increase the flow rate to apart where a heat dissipation performance is required.

In addition, the cooling medium inlet 11 and the cooling medium outlet 12 are opposed to each other, with the result that the part of the upstream distribution portion 15 having the large cross sectional area and the part of the downstream distribution portion 16 having the small cross sectional area are arranged in a stacked manner, and the part of the upstream distribution portion 15 having the small cross sectional area and the part of the downstream distribution portion 16 having the large cross sectional area are arranged in a stacked manner. Therefore, the height of the upper and lower distribution portions may be halved without increasing the pressure losses of the distribution portions.

Further, when the reductions in height of the distribution portions 15 and 16 are achieved, not only the cooler 10 is reduced in height, which leads to the reduction in size of the electric power converter 1, but also the path length of the passage of the connecting portion 17, which is proportional to the height of the cooler 10, may be reduced, and hence the increase in pressure loss of the cooler 10 due to the adoption of the configuration of the present invention may also be reduced.

In addition, in the configuration of the second embodiment, the switching elements and the free wheel elements are arranged on different surfaces on the upper and lower sides, and hence there is a problem of a switching surge that occurs due to the switching operation of the switching elements. The switching surge is proportional to a current change rate di/dt and wiring inductance between the switching elements and the free wheel elements, and hence when the current change rate di/dt cannot be reduced, the wiring inductance between the switching elements and the free wheel elements needs to be reduced.

In the configuration of the second embodiment, the diodes (D2, 4, and 6), which are connected to the negative side of the power source and to which current returns at the time of switching of the switching elements (SW1, 3, and 5) connected to the positive side of the power source, are arranged immediately below the switching elements on the positive side to reduce a wiring distance in a planar direction, and at the same time, a wiring distance in the up and down direction is also reduced by the above-mentioned reduction in thickness of the cooler 10 to reduce the wiring inductance, which is proportional to the wiring distance. The same applies to the wiring between the switching elements (SW2, 4, and 6) on the negative side and the free wheel elements (D1, 3, and 5) on the positive side.

Note that, the wiring between the upper and lower sides that connects the switching elements and the free wheel elements is implemented as a connection bus bar 81 illustrated in FIG. 15. The connection bus bar 81 is arranged via the through hole provided in the passage housing 53, and hence may be cooled by the cooling medium to reduce the cross sectional area.

The through hole connects a space on the switching element side and a space on the free wheel element side of the electric power converter 1. In the space on the free wheel element side, there are arranged the smoothing capacitor 73, an output bus bar 82 for supplying an output current of the three-phase inverter to an outside of the electric power converter 1, an input bus bar (not shown) for supplying power to the smoothing capacitor 73, and the like, which are high-voltage circuits and need to be insulated from the cooling medium that is continuous with the outside of the device.

However, if the sealing means between the heating element mounting plates 51 and the passage housing 53 is broken, the cooling medium flows to the space on the free wheel element side via the through hole described above, and hence the high-voltage circuits such as the connection bus bar 81, the free wheel elements, the smoothing capacitor 73, the output bus bar 82, and the input bus bar are immersed in the cooling medium.

To address this problem, in the cooler 10 of the second embodiment, the heating element mounting plates 51 and the passage housing 53 are bonded and integrated by brazing, with the result that metal-based sealing means may be used without using resin-based sealing means such as an O-ring or a liquid packing, which has a problem in heat resistance, for the bond part with a risk of a leakage of the cooling medium, and further, the members do not need to be fastened by a screw or the like with a small pitch as with the O-ring or the liquid packing, which is advantageous in reducing the size of the electric power converter 1 and in improving vibration resistance because of the continuous bonding.

In addition, in the configuration of the second embodiment, the switching elements are arranged in a concentrated manner on one surface of the cooler 10 so that the control board 30 for driving the switching elements may be integrated into one side and arranged in proximity to the switching elements. When the switching elements and the control board 30 are provided in proximity, a malfunction due to noise may be avoided, and in addition to the improvement in noise immunity, the size and cost may also be reduced by a reduction in size of the components.

Third Embodiment

Figure 16:
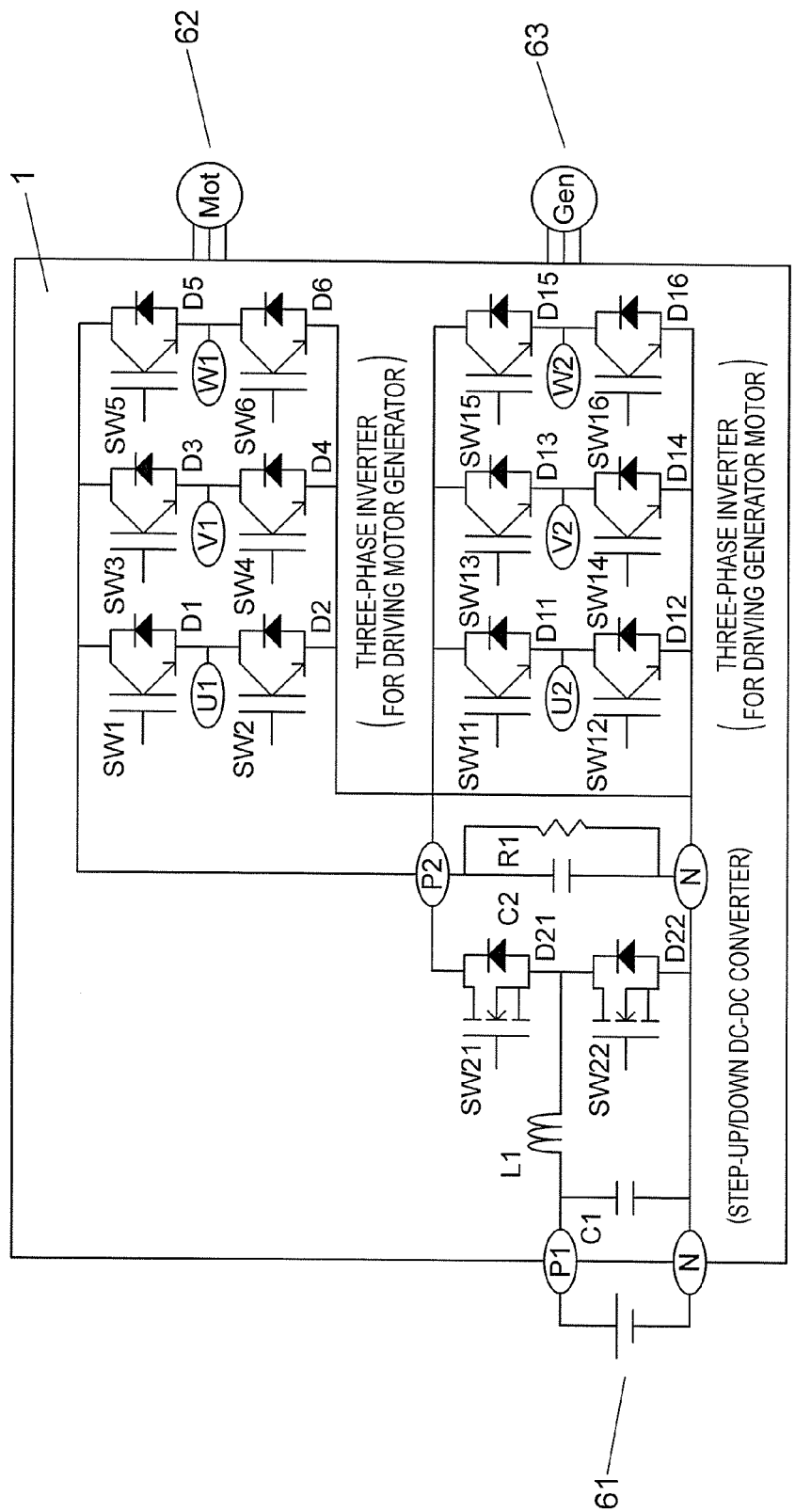
FIG. 16 is a configuration diagram illustrating a main circuit of an electric power converter according to a third embodiment of the present invention, along with peripheral devices.

FIG. 16 is a configuration diagram illustrating a main circuit of an electric power converter 1 according to the third embodiment of the present invention, along with peripheral devices (a DC power source 61, a motor generator 62, and a generator motor 63).

In FIG. 16, the electric power converter 1 includes a three-phase inverter for driving a motor generator, which includes switching elements SW1 to SW6 and free wheel elements D1 to D6, a three-phase inverter for driving a generator motor, which includes switching elements SW11 to SW16 and free wheel elements D11 to D16, and a step-up/down DC-DC converter, which includes switching elements SW21 and SW22 and free wheel elements D21 and D22.

The electric power converter 1 is, for example, an electric power converter for use in a two-motor hybrid electric vehicle, which uses the motor generator 62 for driving the vehicle, uses the generator motor 63 for generating power by the internal combustion engine, and uses the voltage of the DC power source 61 by stepping up the voltage to a voltage optimal for size reduction and highly efficient driving of the motor generator 62 and the generator motor 63.

Figure 17:
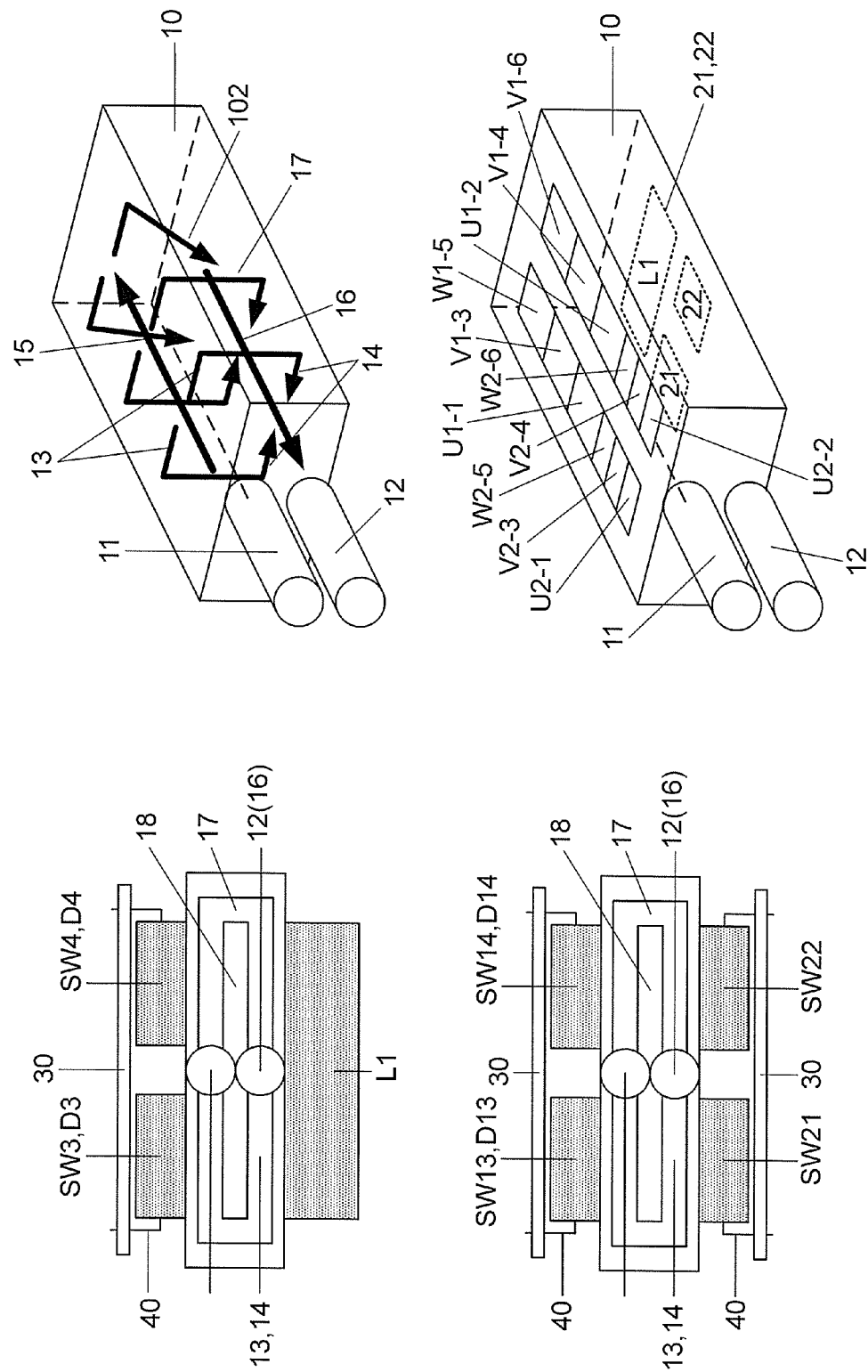
FIG. 17 is an explanatory diagram illustrating a configuration of a cooling medium passage and arrangement of heat generating bodies in the electric power converter according to the third embodiment of the present invention.

Next, a configuration of a cooling medium passage of a cooler 10 and arrangement of heat generating bodies of the electric power converter 1 according to the third embodiment of the present invention is illustrated in FIG. 17. FIG. 17 is an explanatory diagram illustrating the configuration of the cooling medium passage and the arrangement of the heat generating bodies in the electric power converter according to the third embodiment of the present invention. In FIG. 17, the cooling medium passage of the cooler 10 of the electric power converter 1 is coupled in order of the cooling medium inlet 11, the upstream distribution portion 15, the upstream cooling portion 13, the connecting portion 17, the downstream cooling portion 14, the downstream distribution portion 16, and the cooling medium outlet 12.

On the upstream cooling portion 13, the switching elements SW1 to SW6 and the free wheel elements D1 to D6 of the three-phase inverter for driving the motor generator, and the switching elements SW11 to SW16 and the free wheel elements D11 to D16 of the three-phase inverter for driving the generator motor are mounted as the heating element 21.

On the downstream cooling portion 14, switching elements SW21 and SW22 of the step-up/down DC-DC converter, which are made of a wide bandgap semiconductor, free wheel elements D21 and D22 made of a wide bandgap semiconductor as well, a reactor L1, and a discharge resistor R1 are mounted as the heating element 22.

In other words, on the upstream cooling portion 13, the three-phase inverter for driving the motor generator, which controls the driving of the vehicle and is most important, is mounted, and on the downstream cooling portion 14, the wide bandgap semiconductor module of the step-up/down DC-DC converter and the reactor, which generate small amounts of heat and have higher heat resistance than the three-phase inverter are mounted.

Figure 18:
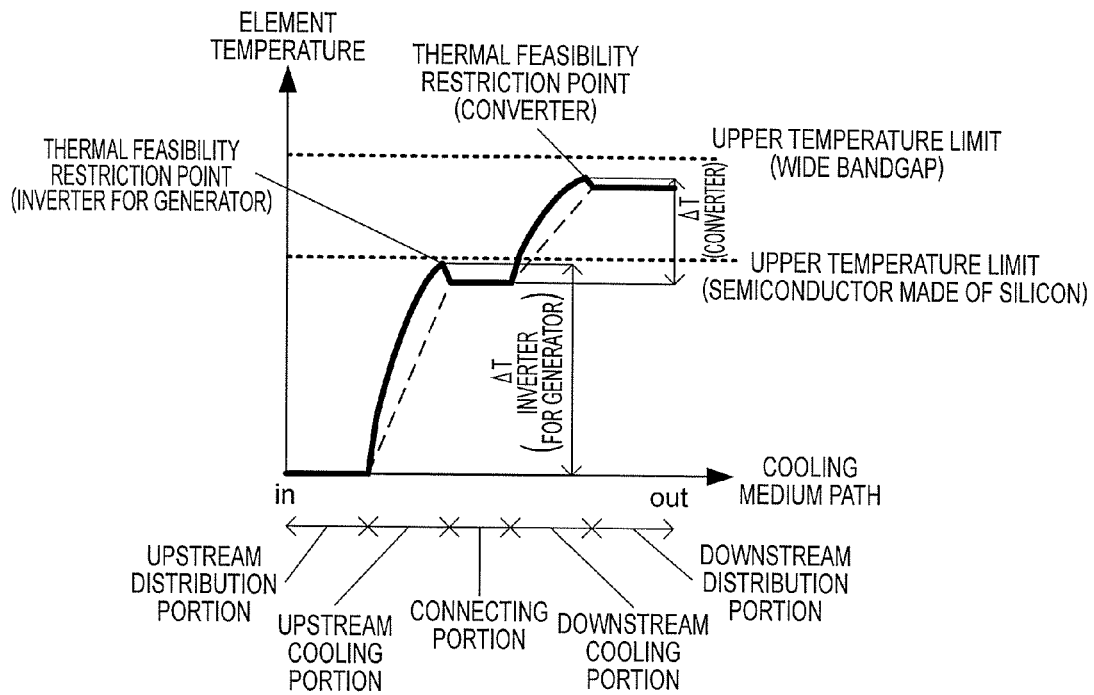
FIG. 18 is an explanatory diagram illustrating increases in temperature of a cooling medium in the electric power converter according to the third embodiment of the present invention.

FIG. 18 is an explanatory diagram illustrating, in the electric power converter 1 according to the third embodiment of the present invention, increases in temperature of a cooling medium due to the passage configuration and the arrangement of the heat generating bodies. With the passage configuration and the arrangement of the heat generating bodies of the third embodiment, the forms of a front side (cooling medium inlet 11 and cooling medium outlet 12) and a back side (side without cooling medium inlet 11 and cooling medium outlet 12) are different.

In other words, on the front side, a semiconductor module of the three-phase inverter for driving the generator motor and a semiconductor module of the step-up/down DC-DC converter, which is constituted of a wide bandgap semiconductor, are arranged respectively on the upstream side and the downstream side as the heat generating bodies 21 and 22, and on the back side, a semiconductor module of the three-phase inverter for driving the motor generator and the reactor of the step-up/down DC-DC converter are arranged respectively on the upstream side and the downstream side as the heat generating bodies 21 and 22.

Looking at the front side in detail, the three-phase inverter for driving the generator motor on the upstream side is cooled by the cooling medium having the lowest temperature, and hence is highly thermally feasible. The step-up/down DC-DC converter on the downstream side is cooled by the cooling medium that is increased in temperature by the three-phase inverter for driving the generator motor on the upstream side, but has no problem in the thermal feasibility because of being a wide bandgap semiconductor element having high thermal resistance and of having a higher temperature limit than a step-up/down converter using a semiconductor made of silicon on the upstream side.

Next, looking at the back side in detail, the three-phase inverter for driving the motor generator on the upstream side is cooled by the cooling medium having the lowest temperature, and hence is highly thermally feasible. The reactor on the downstream side is cooled by the cooling medium that is increased in temperature by the three-phase inverter for driving the motor generator on the upstream side, but has no problem in the thermal feasibility because of generating a significantly smaller amount of heat than the three-phase inverter and of having large heat capacity and hence high instantaneous heat resistance.

Further, in the configuration of the third embodiment, it is the inverter for driving the motor generator for use in driving the vehicle that is cooled by the cooling medium having the lowest temperature, and even when the environmental temperature or the cooling medium temperature is increased abnormally, high power can be maintained to the end, to thereby contribute to the reliability and safe operation of the vehicle.

The inverter for driving the generator motor, which is also cooled by the cooling medium having the lowest temperature, is mounted with a step-up/down converter generating a large amount of heat on the downstream side, and cannot maintain high power to the end as well as the inverter for driving the motor generator for use in driving the vehicle because the thermal feasibility of the step-up/down converter is affected.

However, a wide bandgap semiconductor having high thermal resistance is used for the step-up/down converter on the downstream side, and hence even when the environmental temperature or the cooling medium temperature is increased abnormally, high power can be maintained relatively to the end. Further, the generator motor is coupled to the internal combustion engine and supplies power to a motor generator for driving the vehicle, and the step-up/down converter also supplies power to the motor generator for driving the vehicle from a DC power source such as a secondary battery. Therefore, even when the environmental temperature or the cooling medium temperature is increased abnormally, when the output of any one of the generator motor and the step-up/down converter is limited, the power supply to the motor generator for driving may always be continued.

Figure 19:
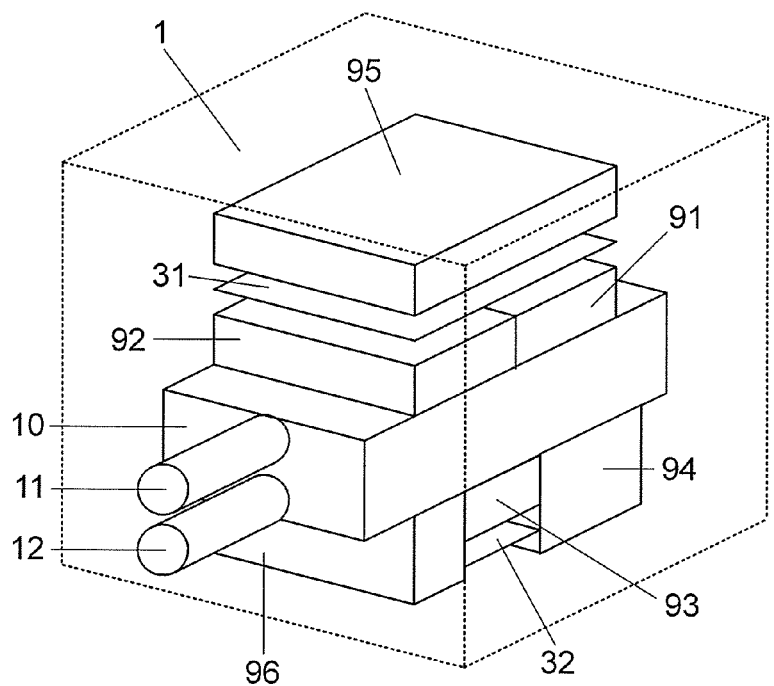
FIG. 19 is a perspective view illustrating the electric power converter according to the third embodiment of the present invention.
Figure 20:
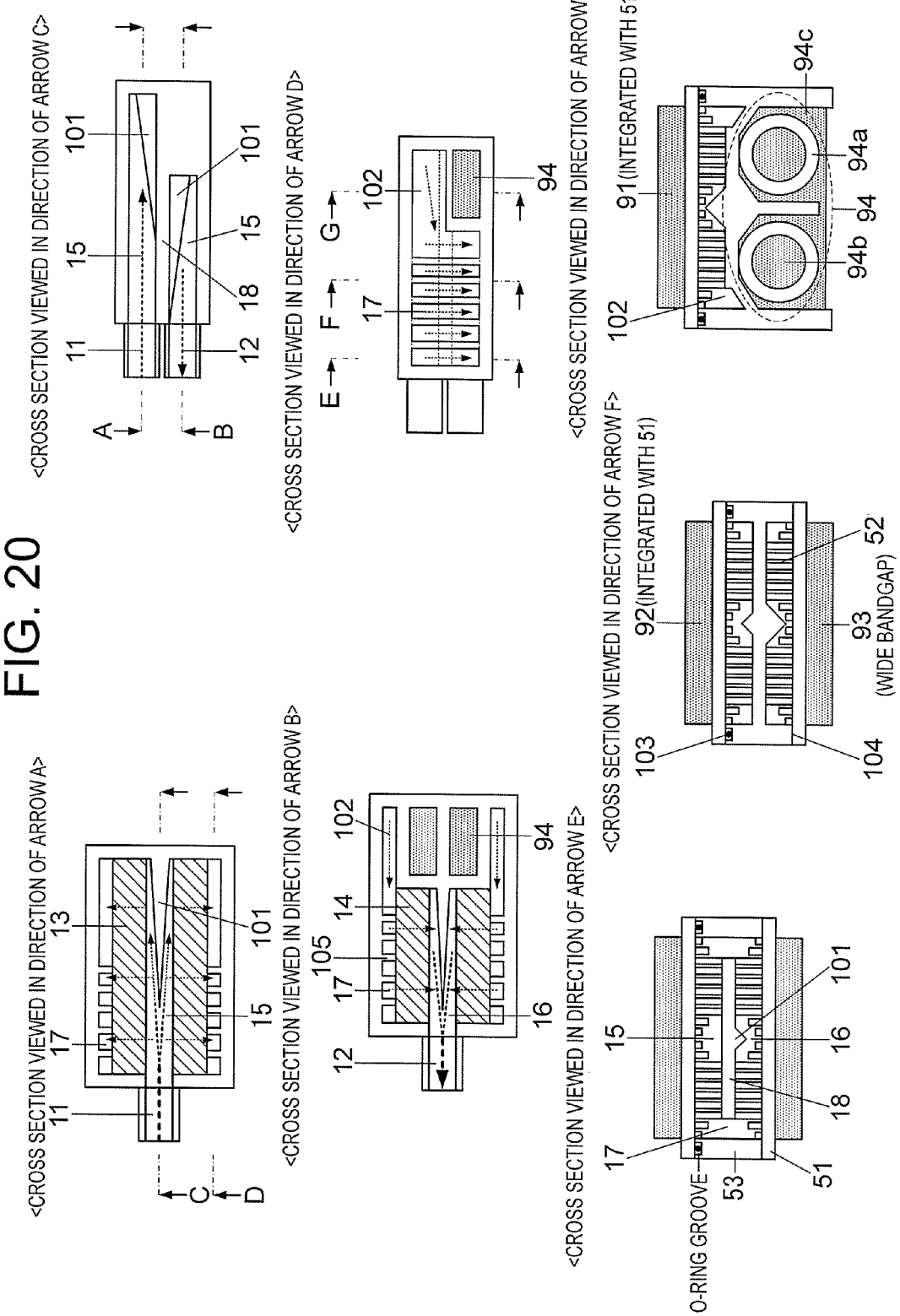
FIG. 20 is a configuration diagram illustrating a cooler in the electric power converter according to the third embodiment of the present invention.

Next referring to FIGS. 19 and 20, structure of the electric power converter 1 according to the third embodiment of the present invention is described. FIG. 19 is a perspective view illustrating the electric power converter 1 according to the third embodiment of the present invention. FIG. 20 is a configuration diagram illustrating the cooler 10 in the electric power converter 1 according to the third embodiment of the present invention.

In the electric power converter 1 according to the third embodiment of the present invention, as illustrated in FIG. 19, on the upper side of the cooler 10, an inverter semiconductor module for motor 91 for use in the three-phase inverter for driving the motor generator including the switching elements SW1 to SW6 and the free wheel elements D1 to D6, and an inverter semiconductor module for generator 92 for use in the three-phase inverter for driving the generator motor including the switching elements SW11 to SW16 and the free wheel elements D11 to D16 are mounted as the heating element 21.

Further, on the lower side of the cooler 10, a semiconductor module for converter 93 for use in the step-up/down DC-DC converter including the switching elements SW21 and SW22, which use a wide bandgap semiconductor, and the free wheel elements D21 and D22, and a reactor 94 for use in the step-up/down DC-DC converter are mounted as the heating element 22.

In addition, above the inverter semiconductor module for motor 91 and the inverter semiconductor module for generator 92, a control board for inverter 31 for driving and controlling the semiconductor modules is mounted, and further above the control board for inverter 31, a secondary smoothing capacitor 95 for smoothing a secondary voltage of the step-up/down DC-DC converter, that is, an inverter input voltage is mounted.

Further, on a lower side of the semiconductor module for converter 93, a control board for converter 32 for driving and controlling the semiconductor module is mounted, and in addition, on the lower side of the cooler 10, a primary smoothing capacitor 96 for smoothing a primary voltage of the step-up/down DC-DC converter is mounted.

In other words, the electric power converter 1 functions, as described above, as the electric power converter for use in a two-motor hybrid electric vehicle, which uses the motor generator for driving the vehicle, uses the generator motor 63 for generating power by the internal combustion engine, and uses the voltage of the DC power source 61 by stepping up the voltage to a voltage optimal for size reduction and highly efficient driving of the motor generator 62 and the generator motor 63.

Further, the cooling medium inlet 11 and the cooling medium outlet 12 are arrayed in one same surface to improve the workability in connecting cooling medium piping, and are arranged on the inverter semiconductor module for generator 92 side.

The cooler 10 of the electric power converter 1 according to the third embodiment of the present invention includes, as illustrated in FIG. 20, heating element mounting plates 51 integrated with a passage housing 53, which also functions as a housing of the reactor 94 and is formed by casting, and with cooling fins 52. The upper heating element mounting plate 51 is connected to the passage housing 53 by an O-ring 103 as sealing means, and the lower heating element mounting plate 51 is bonded to the passage housing 53 by brazing 104 as sealing means.

Further, the reactor 94 includes a coil 94a, a magnetic core 94b, a sealing resin 94c, and the like and has a large mass, and hence the reactor 94 is directly integrated with the passage housing 53 formed by casting to secure the vibration resistance. Further, also for the heating element mounting plates 51 on which the semiconductor modules are mounted, a thick extruded material is adopted in order to mount a large number of semiconductor modules, and after the extrusion, the fins are formed by cutting processing so that the cooling fins 52 and the heating element mounting plates 51 are integrated, to thereby secure the vibration resistance.

The electric power converter 1 in the third embodiment has a plurality of functions, and hence replaceability when the functions fail also needs to be taken into consideration. Therefore, the O-ring 103 is used as the sealing means between the upper heating element mounting plate 51 and the passage housing 53, and hence the upper inverter and the lower converter may be separated so as to be easily replaced in case of failure.

On the other hand, the lower heating element mounting plate 51 and the passage housing 53 are bonded by the brazing 104. Due to the bonding by brazing, the lower heating element 22 cannot be separated from the passage housing 53, but has no problem because the lower heating element 22 only includes components that function when combined with the reactor 94 and can be separated from the inverter.

Further, by bonding the lower heating element mounting plate 51 and the passage housing 53 by the brazing 104, the sealing reliability is increased as compared to the sealing means such as the O-ring 103 or the liquid packing, to thereby avoid the water leakage due to the age-related deterioration of the lower sealing, which tends to have a high temperature on the downstream side of the passage, and the immersion of converter components in the cooling medium due to the water leakage.

Note that, the heating element mounting plates 51 and the passage housing 53 may be bonded by laser welding or the like instead of the brazing 104, but because the cooler 10 in the third embodiment has a large size and a large warpage, the brazing 104 is adopted for the purpose of filling the gap. The brazing 104 may employ a method of putting all the components in a high-temperature furnace or a method of mounting the components on the cooler 10 and then locally heating the components by laser light or the like.

Figure 21:
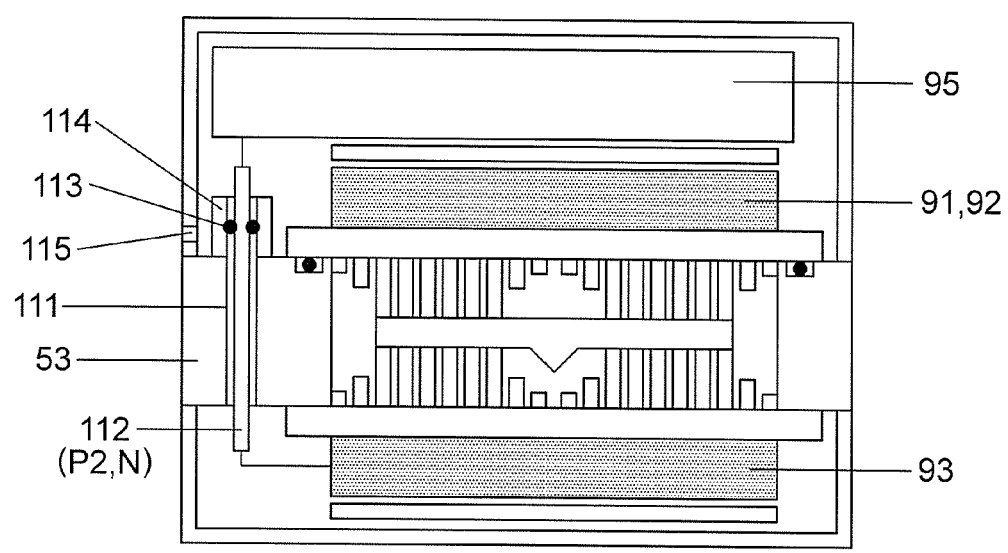
FIG. 21 is an explanatory diagram illustrating a structure against water damage on a lower side due to water leakage in the electric power converter according to the third embodiment of the present invention.

FIG. 21 is an explanatory diagram illustrating a structure against water damage on the lower side due to water leakage in the electric power converter 1 according to the third embodiment of the present invention. As in the second embodiment, the electric power converter 1 according to the third embodiment includes a main circuit component for connecting the upper and lower sides, and hence includes a vertical through hole 111 as illustrated in FIG. 21.

The vertical through hole 111 may cause the immersion of the lower side in the cooling medium when the upper sealing means fails. However, in the configuration of the third embodiment, the only main circuit component for connecting the upper and lower sides is a P2-N secondary voltage bus bar 112, which as opposed to the second embodiment is a wiring that does not affect the switching surge so that a reduction in inductance is not necessary, and hence the bus bar 112 may be configured relatively arbitrarily.

Therefore, as illustrated in FIG. 21, bus bar portion sealing means 113 for filling the vertical through hole 111 around the bus bar 112, an overflow end wall 114, and a drain hole 115 prevent the cooling medium from entering the lower side when the upper sealing means fails.

Note that, in the distribution portions 15 and 16 of the passage in the third embodiment, a convex portion is provided for the same reason as in the second embodiment to make the flow rate of the cooling portions uniform. It should be noted, however, that in the second embodiment, the concavity and convexity are in the up and down direction in order to reduce the height of the cooler 10, but in the third embodiment, the height of the passage housing is determined by the reactor 94, and the concavity and convexity is in the left and right direction of the plane because there is no need to stack the concavity and convexity in the up and down direction and reduce the height.

Further, each of the left and right connecting portions 17 does not form one path but is partitioned by a plurality of connecting portion partitions 105. The electric power converter 1 in the third embodiment includes a plurality of functions and hence has a larger size than the second embodiment, but the connecting portion partitions 105 firmly couples the partition portion 18 and the passage housing 53 to increase the stiffness of the passage housing 53 and secure the vibration resistance of the electric power converter 1.

Further, by changing an arrangement interval of the connecting portion partitions 105, the passage cross sectional areas of the connecting portions 17 are adjusted to optimize the flow rates of the cooling portions. The electric power converter 1 of the third embodiment includes a plurality of functions, and hence it may not always be optimal to make the flow rates of the cooling portions uniform as in the electric power converter 1 of the second embodiment. Therefore, the flow rates of the cooling portions are optimized by the arrangement interval of the connecting portion partitions 105 and the shape of the cooling fins 52.

Further, the reactor 94 has a bottom surface that is cooled by the cooling portions of the inverter semiconductor module for motor 91, and the connecting portion located on the downstream side of the cooling portions of the inverter semiconductor module for motor 91 is extended to the lower side in the direction of the side surface of the reactor 94 and functions as a reactor cooling portion 102.

The main heat generating portion of the reactor 94 is the coil 94a that is circularly wound. When the reactor cooling portion 102 is brought in proximity to the coil 94a, a heat dissipation property of the reactor 94 is improved, and the effects of the inverter semiconductor module for motor 91 on a heat dissipation property is reduced. In addition, the distance between the coil 94a and the cooling medium is increased by a convex shape 101 of the upstream distribution portion 15 to reduce the heat dissipation property from the reactor 94 to the distribution portions 15 and 16 so that the increase in temperature of the cooling medium in the distribution portions 15 and 16 is suppressed.

Note that, by taking the advantage that the upper heating element mounting plate 51 and the passage housing 53 are constructed separately with the O-ring 103 as the sealing means, the inverter semiconductor module for motor 91 and the inverter semiconductor module for generator 92 are integrally formed with the upper heating element mounting plate 51.

With this configuration, as opposed to the conventional semiconductor module, a thermal compound having low thermal conductivity such as heat dissipation grease does not need to be applied between the semiconductor module and the cooler 10 (in this case, heating element mounting plates 51). In this manner, the heat dissipation property from the semiconductor element for the inverter to the cooling medium may be increased, which allows the reduction in size of the semiconductor module for the inverter, and the reduction in cost owing to the reduction in size of the semiconductor element.

On the other hand, the lower heating element mounting plate 51 is bonded to the passage housing 53 by the brazing 104, and hence the heating element mounting plates 51 and the semiconductor module for converter 93 are difficult to integrate. However, wide bandgap semiconductor elements are used for the semiconductor module for converter 93, and because of their high heat resistance and low loss characteristics, no problem occurs even with a form in which a thermal compound having low thermal conductivity such as heat dissipation grease is applied between the semiconductor module and the cooler 10 (in this case, heating element mounting plates 51) as in the conventional semiconductor module.

What is claimed is:
1. An electric power converter, comprising:
   a cooler, which includes a passage through which a cooling medium flows; and
   at least two heat generating bodies, which are dispersedly arranged on upper and lower surfaces of the cooler to be cooled by the cooler,
   wherein the passage from a cooling medium inlet to a cooling medium outlet of the cooler includes:
   an upstream cooling portion and a downstream cooling portion which cools the at least two heat generating bodies;
   an upstream distribution portion located on a cooling medium inlet side;
   a downstream distribution portion located on a cooling medium outlet side;
   connecting portions which are disposed proximate respective side surfaces of the cooler and connect the upstream cooling portion and the downstream cooling portion; and
   a partition portion which partitions the upstream cooling portion and the downstream cooling portion, and the upstream distribution portion and the downstream distribution portion, and
   wherein the passage is connected so that the cooling medium flows in order of the upstream distribution portion, the upstream cooling portion, the connecting portion, the downstream cooling portion, and the downstream distribution portion, the cooling medium splits into two flows from the upstream distribution portion, in respective opposing directions toward each of the respective side surfaces, to form the upstream cooling portion proximate the upper surface, each of the two flows enters a corresponding connecting portion and a corresponding downstream cooling portion, and the two flows join each other onto the downstream distribution portion proximate the lower surface.

2. An electric power converter according to claim 1, wherein an allowable temperature of the heating element mounted on the downstream cooling portion is higher than an allowable temperature of the heating element mounted on the upstream cooling portion.

3. An electric power converter according to claim 1, wherein the heating element mounted on the downstream cooling portion comprises a wide bandgap semiconductor.

4. An electric power converter according to claim 3, wherein the wide bandgap semiconductor comprises at least one element selected from the group consisting of: silicon carbide; a gallium nitride-based material; and diamond.

5. An electric power converter according to claim 1, wherein an amount of heat generated by the heating element mounted on the upstream cooling portion is larger than an amount of heat generated by the heating element mounted on the downstream cooling portion.

6. An electric power converter according to claim 1, wherein the heating element mounted on the upstream cooling portion comprises a switching element.

7. An electric power converter according to claim 1, wherein the heating element mounted on the downstream cooling portion comprises a converter configured to control a supply voltage.

8. An electric power converter according to claim 1, wherein the heating element mounted on the upstream cooling portion comprises a semiconductor module to be used in a power converter configured to control a motor for driving a vehicle.

9. An electric power converter according to claim 1, wherein a passage cross sectional area of the connecting portion and passage cross sectional areas of the upstream cooling portion and the downstream cooling portion are substantially equal.

10. An electric power converter according to claim 1, wherein a passage cross sectional area of the upstream distribution portion is reduced farther from the cooling medium inlet side, and a passage cross sectional area of the downstream distribution portion is increased closer to the cooling medium outlet side.

11. An electric power converter according to claim 1, wherein the cooler comprises:

cooling fins integrated with heating element mounting plates; and a passage housing integrated with the partition portion, wherein the cooling fins integrated with the heating element mounting plates are made of aluminum and processed by extrusion, and then a surface on which the at least two heat generating bodies are not mounted is processed by one of cutting and forging so that parts of the at least two heat generating bodies are arranged on a plane including at least one of the connecting portion, and the upstream distribution portion and the downstream distribution portion, and wherein the at least one of the connecting portion, and the upstream distribution portion and the downstream distribution portion has a part of a function of the upstream cooling portion and the downstream cooling portion.

12. An electric power converter according to claim 1, wherein the cooler comprises:

cooling fins integrated with heating element mounting plates; and a passage housing integrated with the partition portion, wherein a through hole formed in the partition portion constitutes the connecting portion, and a concavity and convexity formed in the partition portion constitutes the upstream distribution portion and the downstream distribution portion, and wherein at least one of the cooling fins integrated with the heating element mounting plates and the passage housing integrated with the partition portion are bonded by one of welding and brazing.

13. An electric power converter according to claim 1, wherein the cooler comprises heating element mounting plates, cooling fins, and the partition portion, wherein a through hole formed in the partition portion constitutes the connecting portion, and wherein the heating element mounting plates, the cooling fins, and the partition portion are bonded by brazing to constitute a part of the passage.

* * * * *